(12) United States Patent
Majerus

(10) Patent No.: US 11,107,509 B1
(45) Date of Patent: Aug. 31, 2021

(54) CONTINUOUS SENSING TO DETERMINE READ POINTS

(71) Applicant: Micron Technology, Inc., Boise, ID (US)

(72) Inventor: Douglas Eugene Majerus, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 16/900,531

(22) Filed: Jun. 12, 2020

(51) Int. Cl.
*G11C 7/06* (2006.01)
*G11C 7/22* (2006.01)
*G11C 16/04* (2006.01)
*G11C 16/26* (2006.01)
*G11C 16/10* (2006.01)
*G11C 7/14* (2006.01)

(52) U.S. Cl.
CPC .............. *G11C 7/065* (2013.01); *G11C 7/14* (2013.01); *G11C 7/222* (2013.01); *G11C 16/0441* (2013.01); *G11C 16/10* (2013.01); *G11C 16/26* (2013.01)

(58) Field of Classification Search
CPC ...... G11C 7/065; G11C 16/10; G11C 16/0441; G11C 16/26; G11C 7/222; G11C 7/14
See application file for complete search history.

(56) References Cited

U.S. PATENT DOCUMENTS 10,672,499 B2 * 6/2020 Huang ................... G11C 29/50

* cited by examiner

*Primary Examiner* — David Lam
(74) *Attorney, Agent, or Firm* — Schwegman Lundberg & Woessner, P.A.

(57) ABSTRACT

A variety of applications can include devices or methods that provide read processing of data in memory cells of a memory de vice without predetermined read levels for the memory cells identified. A read process is provided to vary a selected access line gate voltage over time, creating a time-variate sequence where memory cell turn-on correlates with programmed threshold voltage. Total string current of data lines of a group of strings of memory cells of the memory device can be monitored during a read operation of selected memory cells of the strings to which a ramp voltage with positive slope is applied to an access line coupled to the selected memory cells. Selected values of the change of the total current with respect to time, from the monitoring of the total current, are determined. Read points to capture data are based on the determined selected values. Additional devices, systems, and methods are discussed.

20 Claims, 12 Drawing Sheets

CONTINUOUS SENSING TO DETERMINE READ POINTS

FIELD OF THE DISCLOSURE

Embodiments of the disclosure relate generally to memory devices and operation of memory devices, and more specifically, to read operations of the memory devices.

BACKGROUND

Memory devices are typically provided as internal, semiconductor, integrated circuits in computers or other electronic devices. There are many different types of memory, including volatile and non-volatile memory. Volatile memory requires power to maintain its data, and includes random-access memory (RAM), dynamic random-access memory (DRAM), or synchronous dynamic random-access memory (SDRAM), among others. Non-volatile memory can retain stored data when not powered, and includes flash memory, read-only memory (ROM), electrically erasable programmable ROM (EEPROM), erasable programmable ROM (EPROM), resistance variable memory, such as phase-change random-access memory (PCRAM), resistive random-access memory (RRAM), magnetoresistive random-access memory (MRAM), or three-dimensional (3D) XPoint™ memory, among others. A 3D X-Point memory is a non-volatile memory (NVM) technology with a stackable cross-grid data access array in which bit storage is based on a change of bulk resistance.

Flash memory is utilized as non-volatile memory for a wide range of electronic applications. Flash memory devices typically include one or more groups of one-transistor, floating gate or charge trap memory cells that allow for high memory densities, high reliability, and low power consumption. Two common types of flash memory array architectures include NAND and NOR architectures, named after the logic form in which the basic memory cell configuration of each is arranged. The memory cells of the memory array are typically arranged in a matrix. In an example, the gates of each floating gate memory cell in a row of the array are coupled to an access line (e.g., a word line). In a NOR architecture, the drains of each memory cell in a column of the array are coupled to a data line (e.g., a bit line). In a NAND architecture, the drains of each memory cell in a string of the array are coupled together in series, source to drain, between a source line and a data line.

As systems increasingly depend on information from data stored in memory devices, reading from memory devices in shorter times becomes more important. However, schemes for reading such data in shorter times still would include measures that the read data is correct. For example, in systems that implement data storage in NAND memory devices, read levels are predicted; and compensation schemes are used to keep the memory device in calibration. Examples of some compensation schemes include continuous read level calibration (cRLC), temperature coefficient (tempco) adjustments, adjustments to access line group settings, and other associated schemes. Compensation schemes such as cRLC and tempco adjustments by error correction (EC) are compensation mechanisms that can have significant error when read levels vary across a die. This variation can be due to differences in age (when the data was written) or be due to material variability. Reading schemes that can provide a substantial simplification of the read path and reduce software complexity and firmware (FW) implementation time in a system would enhance the ability of systems to provide reliable data in a shorter time than conventionally provided.

BRIEF DESCRIPTION OF THE DRAWINGS

The drawings, which are not necessarily drawn to scale, illustrate generally, by way of example, but not by way of limitation, various embodiments discussed in the present document.

DETAILED DESCRIPTION

Figure 1:
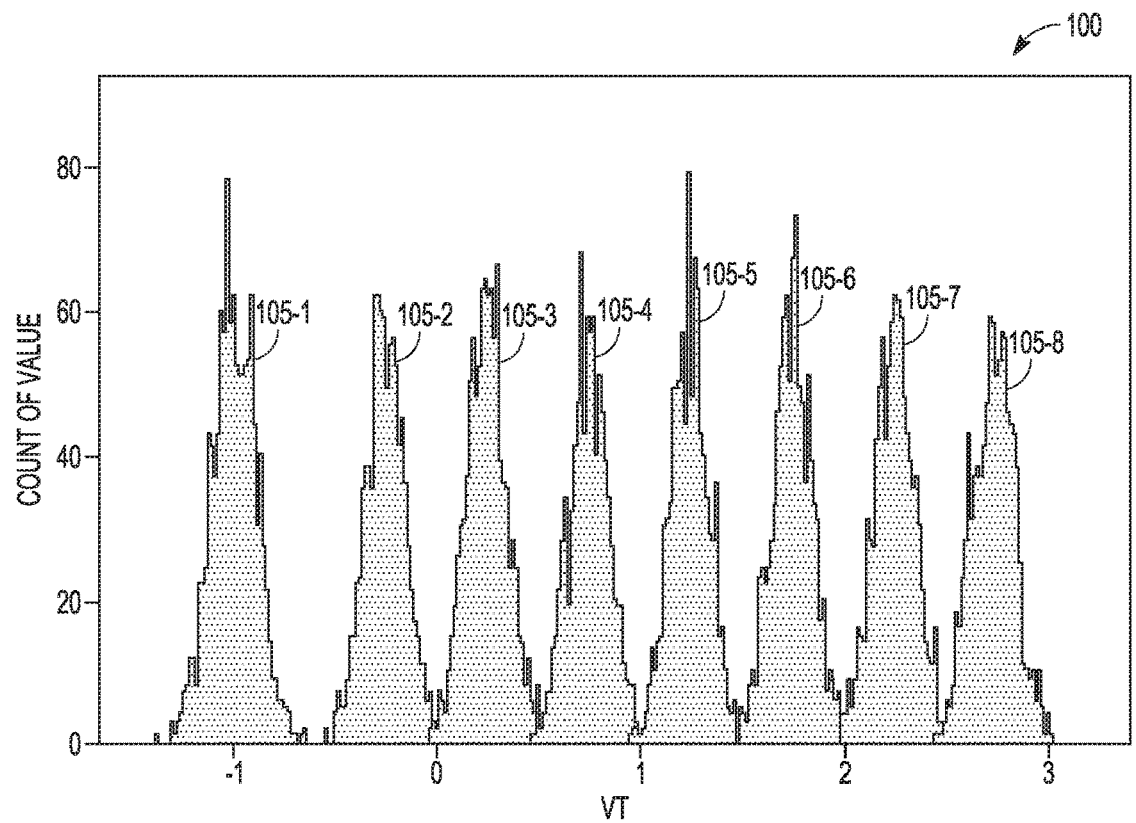
FIG. 1 is a plot of an example simulation of threshold voltage distributions of programmed states of memory cells of a memory device, according to various embodiments.

The following detailed description refers to the accompanying drawings that show, by way of illustration, various embodiments that can be implemented. These embodiments are described in sufficient detail to enable those of ordinary skill in the art to practice these and other embodiments. Other embodiments may be utilized, and structural, logical, mechanical, and electrical changes may be made to these embodiments. The various embodiments are not necessarily mutually exclusive, as some embodiments can be combined with one or more other embodiments to form new embodiments. The following detailed description is, therefore, not to be taken in a limiting sense.

In various embodiments, a method can be implemented for reading data from a memory device without waiting for stabilization at a read point, that is, conducting a read in transition. The memory device can be a NAND memory device. This method can be performed by modifying the read process to vary a selected access line gate voltage over time, creating a time-variate sequence where memory cell turn-on correlates with programmed threshold voltage. The proper time to capture the read can be determined by monitoring a total string current applied to multiple data lines and applying signal processing to understand the data stream. The read points can be implemented at the points in time where the rate of change of the total monitored current stops decreasing and starts increasing plus a time corresponding to an offset between the total string current and bit minimization measurement method. Use of continuous sensing provides dynamic feedback to determine read levels during a read process. When the right data line conditions exist for optimum read or best read, data can be captured. This read process can provide a mechanism to substantially maximize common mode rejection with no predetermined read levels. A system using such procedures besides making extensive use of common mode noise rejection can calibrate itself during the read process to maintain best bit error rate over a wide range of conditions.

Both NOR and NAND flash architecture semiconductor memory arrays of flash memory devices are accessed through decoders that activate specific memory cells by selecting an access line (WL) coupled to gates of specific memory cells. In a NOR architecture semiconductor memory array, once activated, the selected memory cells place their data values on data lines, causing different currents to flow depending on the state at which a particular cell is programmed. In a NAND architecture semiconductor memory array, a high bias voltage is applied to a drain-side select gate (SGD) line. Access lines coupled to the gates of the unselected memory cells of each group are driven at a specified pass voltage (e.g., Vpass) to operate the unselected memory cells of each group as pass transistors (e.g., to pass current in a manner unrestricted by their stored data values). Current then flows in the line between the source line and the data line through each series-coupled group, restricted only by the selected memory cells of each group, placing current encoded data values of selected memory cells on the data lines.

Each flash memory cell in a NOR or NAND architecture semiconductor memory array can be programmed individually or collectively to one or a number of programmed states. For example, a single-level cell (SLC) can represent one of two programmed states (e.g., 1 or 0), representing one bit of data. Flash memory cells can also represent more than two programmed states, allowing the manufacture of higher density memories without increasing the number of memory cells, as each cell can represent more than one binary digit (e.g., more than one bit). Such cells can be referred to as multi-state memory cells, multi-digit cells, or multi-level cells (MLCs). In certain examples, MLC has been referred to as a memory cell that can store two bits of data per cell (e.g., one of four programmed states). MLC is used herein in its broader context to refer to any memory cell(s) that can store more than one bit of data per cell (i.e., that can represent more than two programmed states). Herein, a memory cell that can store two bits of data per cell (e.g., one of four programmed states) can be referred to as a duo-level cell (DLC). A triple-level cell (TLC) can refer to a memory cell that can store three bits of data per cell (e.g., one of eight programmed states). A quad-level cell (QLC) can store four bits of data per cell, and a penta-level cell (PLC) can store 5 bits of data per cell.

In a memory array using MLCs, each memory cell stores data according to a respective programmed state of the number of programmed states applicable to the MLC cell capacity. A programmed state is achieved by programming the respective memory cell to a specific VT. With the MLC being a TLC, there are eight programmed states with each of the eight programmed state having an associated VT. Memory cells programmed to one specific programmed state are intended to have the same value of VT; however, the value of the VT for individual memory cells vary from the specific VT. As a result of these variations, there is a distribution of the number of memory cells about the VT for the specific programmed state.

FIG. 1 is a plot 100 of an example simulation of VT distributions of programmed states of memory cells of a memory device. The plot 100 shows the count of memory cells with respect to VT value. In this plot, distributions 105-1, 105-2, 105-3, 105-4, 105-5, 105-6, 105-7, and 105-8 are located about eight different VT values. These eight different VT values can correspond to a memory array using TLCs. When reading a page of memory cells, the number of memory cells of the page corresponding to specific VT values are within a window between the valleys separating the distributions 105-1, 105-2, 105-3, 105-4, 105-5, 105-6, 105-7, and 105-8.

Figure 2:
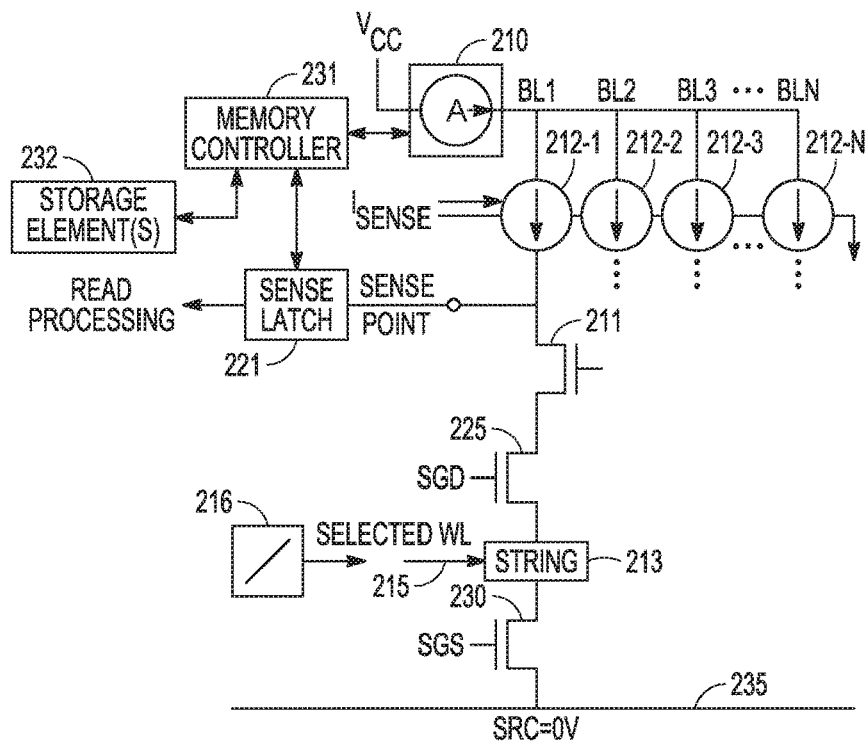
FIG. 2 is a representation of an all-bit-line architecture of a memory device for a current sensing scheme with a mechanism added to measure total data line current, according to various embodiments.

FIG. 2 is a representation of an all-bit-line (ABL) architecture of a memory device for a current sensing scheme with a mechanism added to measure total data line current. A supply source, $V_{CC}$, is coupled to a group of multiple data lines, BL1, BL2 . . . BLN of a memory array of the memory device with a current sensor 210 located in-line from $V_{CC}$ to a node that is common to each of BL1, BL2, BL3 . . . BLN. The current sensor 210 can continuously sense the total current to the group of data lines BL1, BL2, BL3 . . . BLN, where the total current measured is a summation of the current in each of these data lines. A current source 212-1 is coupled to data line BL1, where the current source 212-1 is arranged to provide current to a string 213 of memory cells. In this sensing scheme, current on the string is controlled, rather than the voltage applied. If the string resistance is high, the current source rails out and additional voltage cannot be applied, such that the sense point stays high. When the resistance of the string drops, the current is limited by the current source and the voltage at the sense point flips to a low value as the string can fully conduct the supplied current. The other data lines BL2 . . . BLN are each coupled to current sources 212-2 . . . 212-N, respectively, to provide current to respective strings of memory cells in a similar manner. The current sources 212-1, 212-2, 212-3 . . . 212-N can be realized as distribution nodes of a common current source that generates a current Isense that is a reference current. Arrangement of each of the data lines BL2, BL3 . . . BLN with their associated strings is arranged in the same manner as data line BL1, but these arrangements are not shown in FIG. 2 for clarity and ease of presentation and discussion.

The current source 212-1 is coupled to a sense point and to a data line clamp 211. The data line clamp 211 couples current source 212-1 to the string 213 via a drain-side select transistor 225 having a drain-side select gate (SGD). The string 213 has multiple memory cells, where each memory cell is coupled to a WL for selection of a respective memory cell. The string 213 is coupled to a source, SRC, that is part of a source line 235 via a source-side select transistor 230 having a source-side select gate (SGS). The data line clamp 211 is used to limit the voltage across the drain-side select transistor 225, the string 213, and the source-side select transistor 230. The value of the voltage of SRC can be lower than Vcc and can be set to ground (zero volts).

In a read operation to read a selected memory cell of the string 213, control signals are applied to SGD and SGS to select the string 213. With the other memory cells of the string 213 in an on-status, a waveform generator 216 applies a signal to a selected WL 215 that is coupled to a gate of the selected memory cell. In the read operation, the signal applied to the selected WL 215 can have a voltage waveform with a positive slope over the time of application of the signal. The waveform generator 216 can be controlled by a memory controller 231 of the memory device. The memory controller 231 can be realized as a memory controller that handles common operations of the memory device with the additional functionality to control a continuous sensing scheme to determine read levels during a read process as taught herein. The signal from the waveform generator 216 can be a ramp signal such as, but not limited to, a linear ramp signal or a non-linear signal.

Data status for the selected memory cell of the string 213 is latched in a sense latch 221 for read processing. The sense latch 221 can be pail of a sense amplifier configured under the control of the memory controller 231 to capture data at the proper time. Alternatively, a separate controller can be used to control a continuous sensing scheme to determine read levels during a read process. Such a separate controller can be realized as a processing device, for example but not limited to a microcontroller. The memory controller 231 can also control monitoring of current measured from the current sensor 210. The memory controller 231 is also coupled to storage element(s) 232 that can store one or more parameters for controlling the sense latch 221 or for monitoring of the total current to BL1, BL2, BL3 . . . BLN. The storage element(s) 232 can be implemented via registers, caches, other small storage capacity, or other storage components of the memory device. The current sources 212-1, 212-2, 212-3 . . . 212-N of the data lines BL1, BL2, BL3 . . . BLN receive a signal to turn on the respective current sources to provide current, Isense, for their respective strings, where each string has a memory ceil coupled to the selected WL 215. The selected WL 215 coupled to the selected memory cell of each string coupled to data lines BL1, BL2, BL3 . . . BLN provides for reading a page of data in a read operation.

Figure 3:
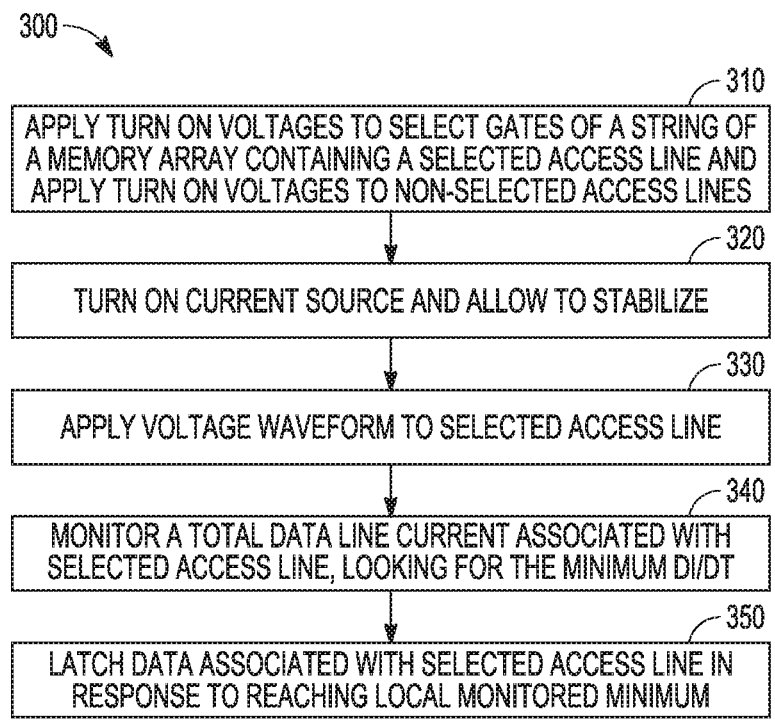
FIG. 3 shows example steps to conduct a read operation in the all-bit-line architecture of FIG. 2 with respect to a selected access line using the current sensor of FIG. 2, according to various embodiments.

FIG. 3 shows an embodiment of an example process 300 to conduct a read operation in the ABL architecture of FIG. 2 with respect to a selected access line using the current sensor 210 of FIG. 2. At 310, turn-on voltages are applied to select gates SGD, SGS of the strings of the memory array coupled to the selected WL 215. Also, turn-on voltages are applied to all other access lines (non-selected access lines), allowing them to stabilize, clearing hot-electrons. SGS, SGD, and all unselected access lines are set to an appropriate value, as well as Isense and data line clamp 211 being set to expected values and stabilized. This procedure is conducted to set up the sense setup so that the voltage value at a sense latch represents the bit state of the respective data line coupled to the sense latch. Isense, which is the value of the current source, can change, but ability to detect proper minimum points associated with a valley point of distributions of programmed states of the memory cells is expected to be compensated.

At 320, the current sources 212-1, 212-2, 212-3 . . . 212-N are turned on and allowed to stabilize. The data lines BL1, BL2, BL3 . . . BLN do not conduct due to the low selected WL 215, to which a turn-on signal has not yet been applied or for which a ramp signal is beginning from an off-status. At 330, a voltage waveform is next applied to the selected WL 215. The data lines start to conduct, with lower VTs of the selected memory cells turning on first. The voltage waveform can be linear or non-linear. The applied voltage value to selected WL 215 can be tuned according to material characteristics of the transistors used for data storage. The voltage applied to selected WL 215 is chosen such that the voltage applied creates an ever increasing data line current output with enough separation in time between when each VT level turns on to facilitate read level capture.

If the target transistor of a selected memory cell has hysteresis that is a function of programmed VT, the turn-on process can be used to differentiate each distribution and latch in data. Applied voltage on the selected WL can be used to change how fast the data lines BL1, BL2, BL3 . . . BLN turn-on. If access line settle time of a selected WL is very small, voltage can be ramped after settling to get the turn-on order and capture the data. In a VT system that has a relatively lower hysteresis, applied voltage can be adjusted to ramp and create a sweep. In a VT system with more hysteresis, applied voltage to a selected WL can be adjusted to speed up settling and to succeed in attaining different distributions to separate.

At 340, a total data line current, I, associated with selected access line is monitored, looking for a minimum dI/dt. The total data line current measured, using current sensor 210 of FIG. 2, is the summation of the currents to each data line BL1, BL2, BL3 . . . BLN. The determination of local minima of dI/dt can be implemented using memory controller 231 and storage elements) 232. The total current flowing in the data lines BL1, BL2, BL3 . . . BLN, which is measured using current sensor 210, is expected to be continuously positively sloping during the voltage application at selected WL 215. The locations in time where the rate of change of the total current (dI/dt) slows are the valleys between distributions such as shown in FIG. 1. This location of slowing is manifested by a decrease in the rate followed by an increase in the rate.

The memory controller 231 of the architecture of FIG. 2 can be used to track several values during the read process. The memory controller 231 or a separate controller realized as a processing device, for example as a signal processor, can control: the monitoring of the total current from the current sensor 210, a determination, from the monitoring of the total current, of attainment of a selected value of a change of the total current with respect to time, and a generation of a capture signal such as a latch signal to sense latches such as the sense latch 221 in response to the determination. Under the control of the memory controller 231, storage elements) 232 can hold a previous iteration current value ($I_{i-1}$), where an iteration is a read location in time with respect to the voltage applied to the selected WL. The memory controller 231 can execute operations to determine a difference between a presently sampled value L and the previous sampled value In and store the value of the difference $(I_i-I_{i-1})$ in the storage elements 232. The storage element(s) 232 can be structured of sufficient size to hold a number of values of differences as iteration i extends over a window of time. From the stored differences, the memory controller 231 can execute operations to determine a minimum of the differences between a sampled value and previous sampled value.

The storage element(s) 232 also can store a value associated with a string current to bit minimum offset. This offset can be determined during manufacture or testing and stored in the storage element(s) 232 for operational use. Alternatively, the memory controller 231 with microcode stored in the storage element(s) 232 can be used to determine the offset. In an embodiment, the offset can operationally be determined using firmware and processing device external to the memory device and stored in the storage element(s) 232. The storage element(s) 232 can be implemented in a number of ways such as but not limited to relatively high speed registers with microcode embedded over the top of the registers. When the difference between previous and current measurements does not set a new low minimum value, then the read level can be captured. The time of capture can be adjusted from the time corresponding to the final low minimum value by an amount of time corresponding to the offset.

At 350, data status associated with selected access line is latched, i.e., a read point is captured, in response to reaching a local monitored minimum. Local monitored minima are associated with the valleys between distributions of programmed states such as shown in FIG. 1. Multiple read points can be latched if data can be moved out of the sense latch 221 by the next read point, which corresponds to the next valley between distributions as the strings continue to turn on. The data lines conduct according to respective VTs of the selected WL 215 associated with BL1, BL2, BL3 . . . BLN. Data status latched in the sense latch 221 coupled to BL1 and similar latched data status of associated with BL2, BL3 . . . BLN are provided for read processing.

Figure 4:
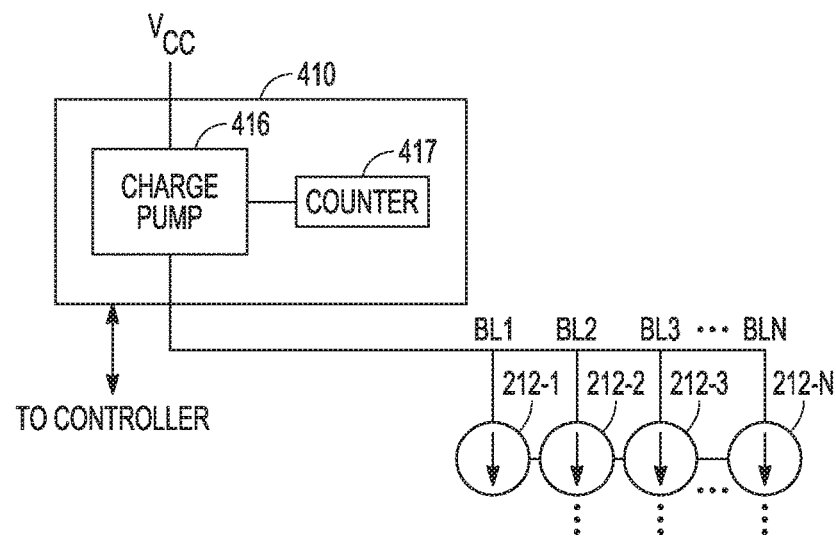
FIGS. 4-6 illustrate example current sensors that can be implemented as the current sensor in FIG. 2, according to various embodiments.
Figure 5:
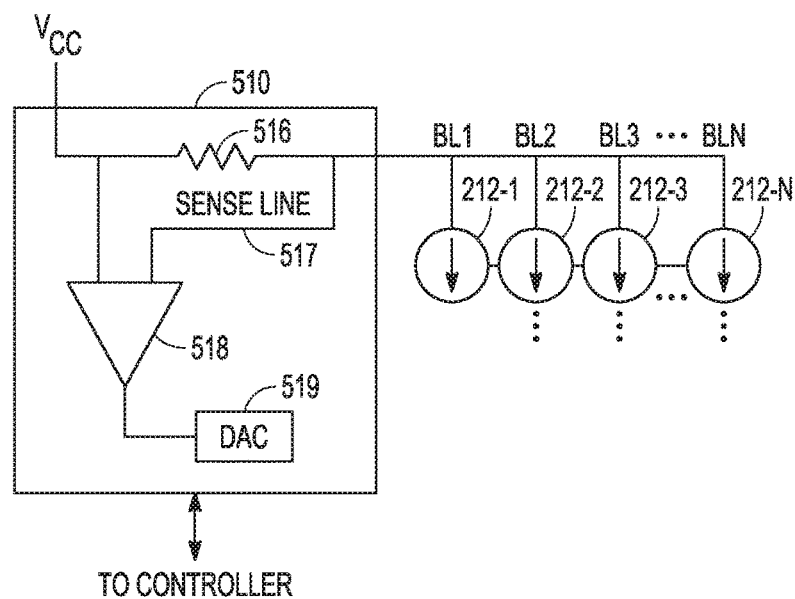
Figure 6:
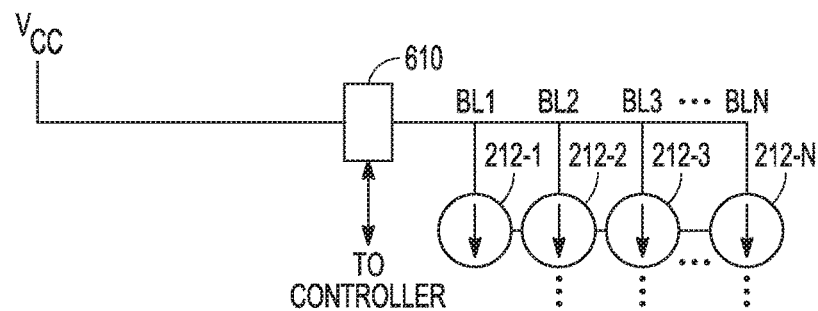

FIGS. 4-6 illustrate embodiments of mechanisms that can be used to measure total data line current to BL1, BL2, BL3 . . . BLN in the ABL architecture of FIG. 2. Each of these embodiments in independent and each can produce a signal of an expected continuous read output signal. FIG. 4 illustrates a current sensor 410 that can be implemented as current sensor 210 in FIG. 2 with current sensor 410 coupled to $V_{CC}$ and to current sources 212-1, 212-2, 212-3 . . . 212-N coupled to data lines BL1, BL2, BL3 . . . BLN, respectively. The current sensor 410 can include a charge pump 416, which can be a high frequency charge pump 416, and a counter 417. The current signal can be provided as the number of pulses during each measurement period, which can be output to a controller such as memory controller 231 of FIG. 2. Charge pump 416 can be structured to function at a higher frequency to attain good resolution on number charges/discharges to provide a good signal for current sensing.

FIG. 5 shows an example current sensor 510 that can be implemented as current sensor 210 in FIG. 2 with current sensor 510 coupled to $V_{CC}$ and to current sources 212-1, 212-2, 212-3 . . . 212-N coupled to lines BL1, BL2, BL3 . . . BLN, respectively. The current sensor 510 can be an in-line resistance 516 used to create a voltage drop that is amplified before being used as a proxy for current by a digital-to-analog converter 519. The in-line resistance 516 can be coupled to an amplifier 518 with one end of the in-line resistance 516 coupled to an input of the amplifier 518 and the other end of the in-line resistance 516 coupled to another input of the amplifier 518 by sense line 517 and with an output of the amplifier 518 coupled to the digital-to-analog converter 519. The in-line resistance 516 can potentially be power delivery resistance of a portion of the connection from $V_{CC}$ to the node to which BL1, BL2, BL3 . . . BLN are coupled. The digital-to-analog converter 519 can tie into other analog circuitry (not shown in FIG. 5), for example, voltage comparators with a secondary voltage source. Adding additional analog circuitry can help with speeding response to the conditions being met without increasing the controller sampling frequency.

FIG. 6 shows a current sensor 610 that can be implemented as current sensor 210 in FIG. 2 with current sensor 610 coupled to $V_{CC}$ and to current sources 212-1, 212-2, 212-3 . . . 212-N coupled to BL1, BL2, BL3 . . . BLN, respectively. The current sensor 610 can be a field effect measurement sensor that senses flux caused by the flowing current, where such field effect measurement sensor is a common non-contact way of measuring current.

Figure 7:
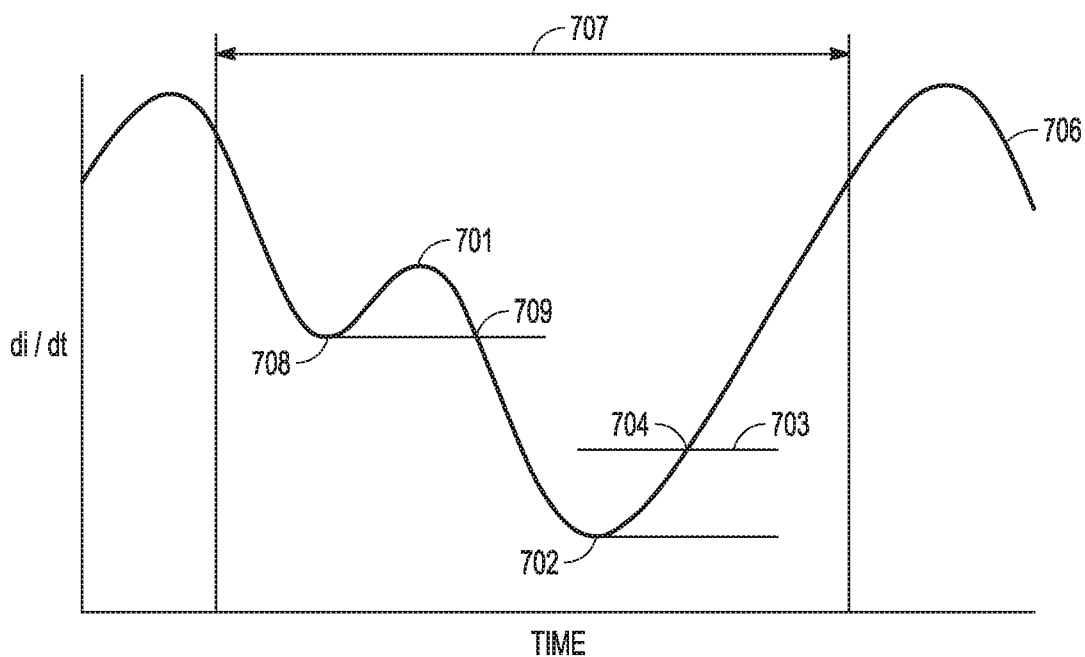
FIG. 7 illustrates a portion of an example curve that can be used to determine attainment of a selected value of a change of the total current with respect to time from monitoring the total current to a group of data lines associated with a selected access line during a read process of a memory device, according to various embodiments.

FIG. 7 illustrates a portion of an example curve 706 that can be used in an embodiment to determine attainment of a selected value of a change of the total current with respect to time from monitoring the total current to a group of data lines associated with a selected access line during a read process of a memory device. The curve 706 is an example plot of the derivative of the total current with respect to time, dI/dt, as a function of time. A read level can be selected by using a window 707 of total current I output with respect to time. The window 707 can be developed from rough constraints of bit dispersion for a NAND memory device to function, and can function as a limit to determine the appropriate search range for the minimum. The window 707 can be used to identify locations of one or more valleys of the curve 706, where the low point of a valley is a local minimum of dI/dt. The window 707 can identify a location of a valley with the window in the interval from $$(\text{valley}+\tfrac{1}{2}+\text{margin})(\text{total number of bits/number of states})*\text{Isense},$$

to $$(\text{valley}+1+\tfrac{1}{2}-\text{margin})(\text{total number of bits/number of states})*\text{Isense},$$

where Isense is the value of current applied to connections from the data lines associated with a selected access line during a read process. This construction of the window 707 assumes that each distribution is composed of approximately the same number of bits. This creates a very large window to search for the minimum equal to approximately a full distribution width. The window 707 is a rough estimate of where the value should appear to make sure that the right valley is selected. The specific read level is selected by determining the time slice where dI/dt is the smallest.

False latching may be present for local minima within the read sampling window 707. The dI/dt value may be continuously sampled looking for a lower read value, with a planned refreshing of the data after a lower value has been discovered. The procedure can include a wait time for a new local minimum before capturing the read point. The final value of the local minimum of dI/dt can be taken as the determination of the attainment of a selected value for reading. The read point can be adjusted by a time associated with an offset, with respect to the time at which the local minimum of dI/dt occurs. There is not a specific time associated with the offset. The dI/dt minimum is determined with a wait for a specific current offset value to provide the time corresponding to the read point.

As shown in the example of FIG. 7, a local minimum of the curve 706 of dI/dt as a function of time can be read at 708, which may lead to false latching. To address this issue, data can be held before considering it to be the final value. By continuing to monitor the total current and generate dI/dt, it can be determined that the previous local minimum at 708 is being exceeded at 709, and a reread can be enabled. The algorithm can have a "debounce" function, as seen in FIG. 7, built in to handle local minimums. Since latching is not set to happen until an offset 703 is reached, if the difference between a peak 701 near 709 and the local min 70S is less than the offset value in 703, the system can reset to the lower minimum rather than triggering. The peak 701 is a local maximum. At 702, a local minimum of dI/dt can be determined and used as a reference. At 704, data is latched due to a current offset associated with curve 706 at 703 relative to the local minimum of dI/dt at 702 to account for the transistor turn-on behaviour close to threshold value of the memory cell. The current provided by the transistor turn-on behaviour close to threshold value and below the threshold voltage level is a subthreshold current having a subthreshold slope with respect to its voltage-current characteristics. Due to the transistor turn-on behaviour close to threshold value of a memory cell, a latch signal can be generated at a time beyond the time of the dI/dt minimization. The mechanism for the read process uses total available string current. The point where the current sources flips is where the data goes from a 1 to a 0. Because the subthreshold slope exists, the supplied current signal will lead the actual optimized read point. After the data is latched with the capture based on a determination of a minimum value of a change of the total current with respect to time for a distribution, another minimum of dI/dt can be determined in a window of time for the next distribution. When the current offset threshold is determined, a trigger signal is sent to the sense latches to capture the data. A NAND memory device now has time to transfer the data out of the sense latches as the access lineWL is driven to the next read point (waiting for the next window to open).

Figure 8:
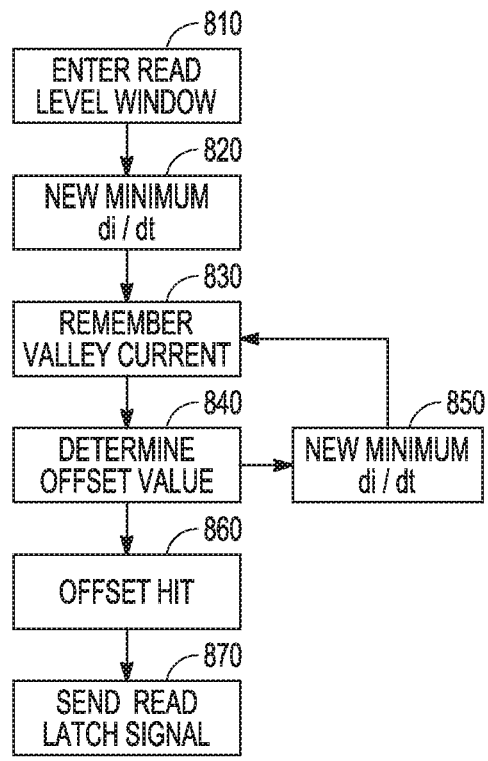
FIG. 8 is an illustration of an example state machine for computations to initiate a read of memory cells of a memory device following the read level determination process reflected in FIG. 7, according to various embodiments.

FIG. 8 is an illustration of an example state machine for computations to initiate a read of memory cells of a memory device following the read level determination process reflected in FIG. 7. At 810, a window for a read level determination is established. The window is a window corresponding one of a number of distributions for possible states of the memory cells. At 820, a value of a minimum of dI/dt is determined from a curve of dI/dt derived from monitoring the total current to a group of data lines corresponding to the memory cells being read. The monitoring can be conducted using the current sensor 210 of FIG. 2. In the initial computations for the given window, this minimum is a new minimum. At 830, the current value of the minimum valley is remembered. For example, this current value can be held in a storage element such as one of the storage elements 232 of FIG. 2.

At 840, an offset value to the current can be determined. The offset is a measured value between a cumulative string current, and a minimum as measured by bit flips for a traditional threshold voltage. The two locations are different because of the subthreshold slope of the memory cell. The determination can be conducted by accessing a storage element, storing parameters for the memory device, for a previously measured value. The offset value can have been determined during manufacture, simulation, or testing with the determined offset value then being stored in the storage element of the memory device. Alternatively, the determination can be conducted by a processor of the memory device using previously collected data. The determination of the offset value by the processor can be made at different times in the lifetime of the memory device.

At 850, if the value of the dI/dt goes below the value of the minimum determined at 820, a new minimum dI/dt is determined and the procedure proceeds back to 830 to remember the new valley current. In this loop, the current offset is again determined, which can be realized by the previous determination of the current offset. At 860, the occurrence in time of hitting the current offset from the time corresponding to the new minimum of dI/dt determined at 850 is evaluated. At 870, in response to the occurrence in time of hitting the current offset, a latch signal can be generated and sent to the latches coupled to capture the data status at this read level. At this point the read is complete for this program distribution and the read process can drive to the next read window for additional reads of programmed states of memory cells of the memory device.

Figure 9:
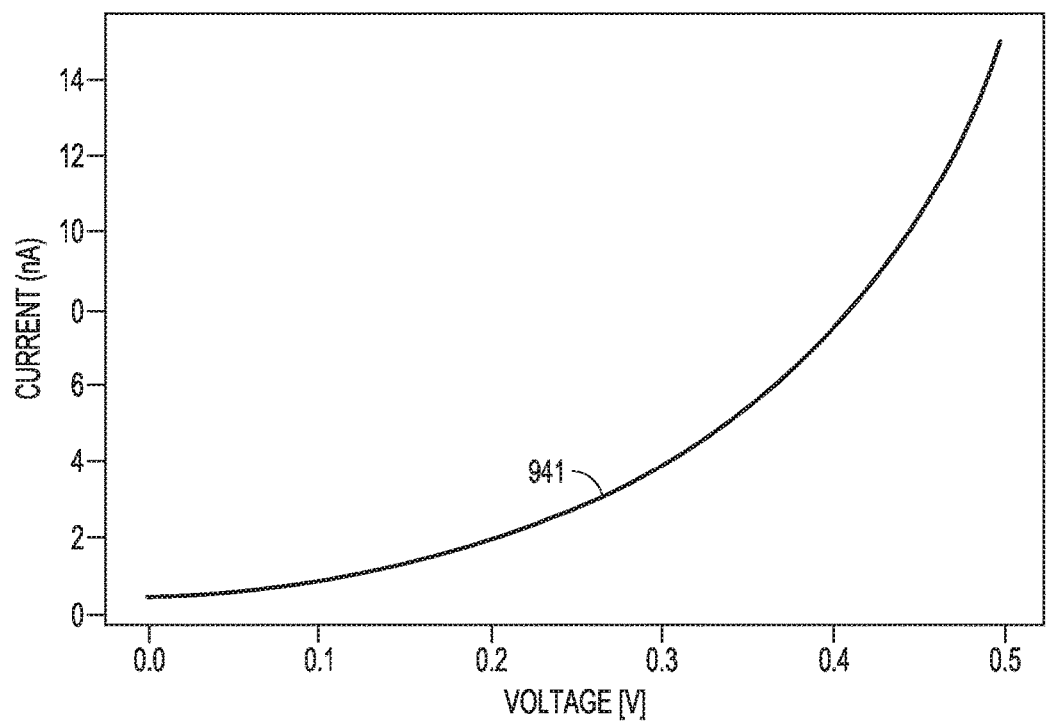
FIG. 9 is a plot, with respect to simulated data, of transistor turn-on behaviour close to threshold value in terms of current versus voltage for the transistor, according to various embodiments.

FIG. 9 is a plot, with respect to simulated data, of transistor turn-on behaviour close to threshold value in terms of current versus voltage for a transistor. Curve 941 indicates that the transistor of a memory ceil conducts at a relatively low level before the voltage applied to the transistor reaches the threshold voltage. This property of the transistor affects the expected current of a string of memory cells with each memory ceil using such a transistor as a memory unit.

Figure 10:
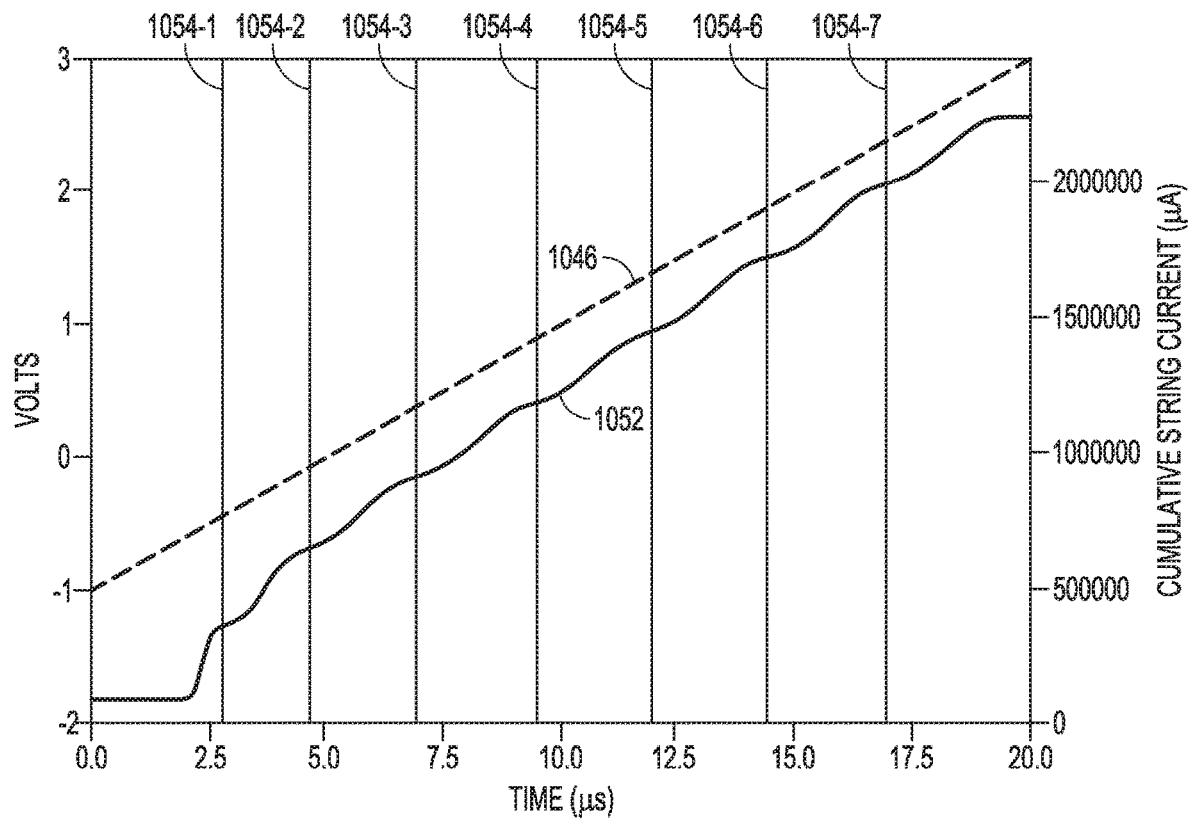
FIG. 10 is an example of a continuous read output of expected data for a combination of the simulated threshold voltage distributions of FIG. 1, the transistor turn-on behaviour close to threshold value of FIG. 9, and an applied access voltage, according to various embodiments.

FIG. 10 is an example of a continuous read output of expected data for a combination of the simulated VT distributions of FIG. 1, the transistor turn-on behaviour close to threshold value of FIG. 9, and an applied WL voltage of curve 1046. A curve 1052 is a plot of string current output as a function of time for the applied WL voltage of curve 1046. As shown, the applied WL voltage in curve 1046 is a ramp signal over a window of time. In this example, the ramp signal is a linear waveform. In other examples, a ramp signal can be a non-linear signal. The current can be readout, for example, at read locations 1054-1, 1054-2, 1054-3, 1054-4, 1054-5, 1054-6, and 1054-7. Evaluation of the transistor turn-on behaviour close to threshold value with respect to a simulation of the VT distributions can generate an offset to current to a read process using the locations in distribution valleys provided by monitoring the change in total data line current with respect to time.

Figure 11:
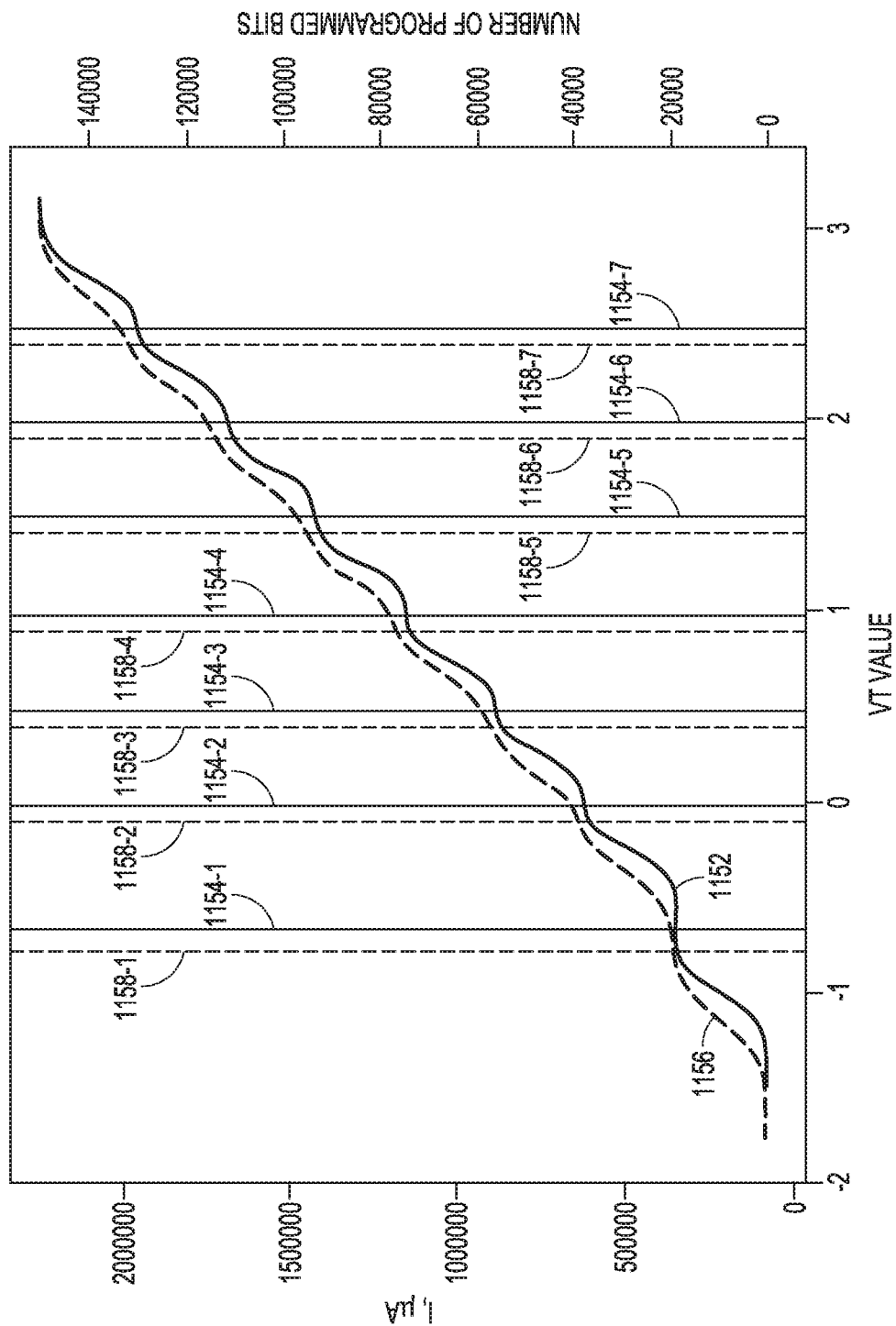
FIG. 11 illustrates an example of a comparison of cumulative string current to programmed bit count for a simulated memory device, according to various embodiments.

FIG. 11 illustrates an example of a comparison of cumulative string current to programmed bit count for a simulated memory device. Curve 1156 is a plot of current versus VT value for a model of current minimization. Curve 1152 is plot of the number of programmed bits versus VT value for a model of cumulative VT. Locations 1154-1, 1154-2, 1154-3, 1154-4, 1154-5, 1154-6, and 1154-7 are predicted bit optimized read levels for curve 1152. Locations 1158-1, 1158-2, 1158-3, 1158-4, 1158-5, 1158-6, and 1158-7 are predicted current optimized read levels for curve 1156. The current associated with the difference between the curve 1156 and the curve 1152 for the associated read levels can be used to determine offsets that can be used in latching data in a read process. This demonstrates a manner in which to determine offset to the subthreshold slope associated with memory cells. As previously noted, the offset is a measured value between the cumulative string current and the minimum as measured by bit flips in a traditional threshold voltage procedure. The two locations are different because of the subthreshold slope. The process reflected in FIG. 10 provides a procedure for calibrating the offset at 840 in the example state machine of FIG. 8 that is to be exceeded from the minimum at 860 in the example state machine of FIG. 8. Locations 1158-1, 1158-2, 1158-3, 1158-4, 1158-5, 1158-6, and 1158-7 correspond to the local minimum of dI/dt at 702 of FIG. 7, and locations 1154-1, 1154-2, 1154-3, 1154-4, 1154-5, 1154-6, and 1154-7 correspond to the data latch point at 704 of FIG. 7 due to the current offset.

Figure 12:
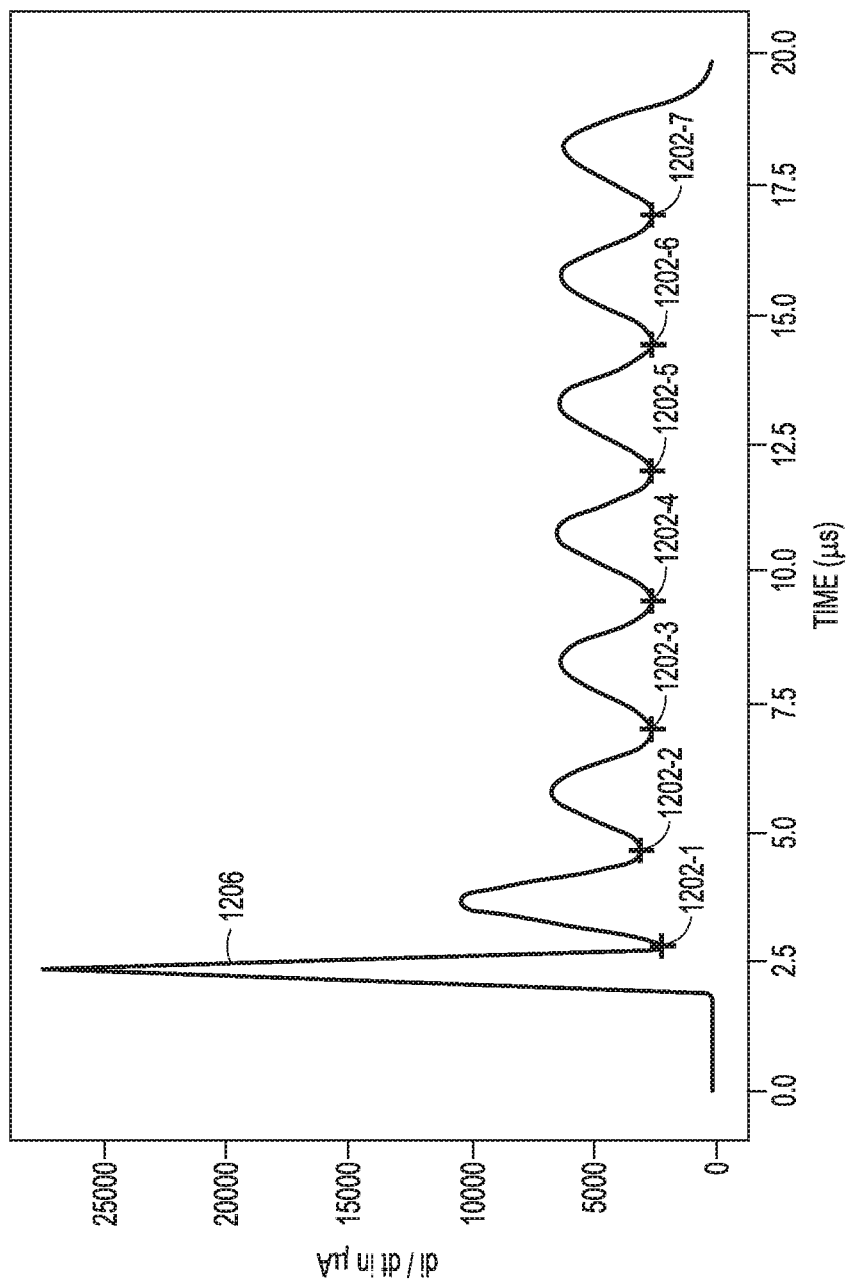
FIG. 12 illustrates an example of a signal to be processed to find valleys associated with distributions of programmed memory states, according to various embodiments.

FIG. 12 illustrates an example of a signal to be processed to find valleys associated with distributions of programmed memory states. Curve 1206 is a plot of dI/dt versus time for curve 1052 of FIG. 10. Curve 1206 is generated from current collected from a group of data lines associated with a selected access line to read memory cells associated with the group of data lines. Minima 1202-1, 1202-2, 1202-3, 1202-4, 1202-5, 1205-6, and 1202-7 of dI/dt can be used with offsets determined from FIG. 11 to generate latch signals to capture data status in a read process.

By setting a read level by a minimum dI/dt in the total data line current to a group of data lines, this read scheme can provide significant common mode rejection to most disturb mechanisms like transient VT, read disturb, program disturb, data retention, thermal correction, etc. This procedure can fully compensate for initial threshold conditions of memory cells of the read scheme. Also, this read scheme can be useful for charge loss expected on a replacement gate NAND memory device. This read scheme also has noise rejection characteristics in which VT changes such as charge gain, charge loss, and VT shifts are fully compensated for by referencing due to setting a read level by a minimum dI/dt in the total data line.

Embodiments of the continuous read sensing setup, provided by the use of minima of dI/dt, are expected to have better data line to data line noise immunity. All data lines would be expected to go through a partial turn-on state as they approach full turn-on, since dI/dt is reduced because the transistors coupled to the selected WL are turning on with a subthreshold slope providing a soft start. The soft start results from the memory cell transistor starting to conduct gradually when the data line current sources are engaged, rather than programmed bits immediately fully conducting. This would spread the current change (dI/dt) over time and reduce coupling compared to a state where the WL is fully conducting and energized during the read process. With no switching of string current on and off, there is power supply stability with less induced bounce. Since the respective data lines can be turned on early in the read process, the string current development time can be much longer than the current sensing process. With not all BLs turning on at the same time, another dimension to increase immunity is provided. Assuming resistance is approximately evenly distributed across data lines, there can be some common mode rejection of string resistance. Data is latched (read) at a different time than when the majority of data lines become conductive, where the read points are in the VT valleys, which have the lowest number of bits that are changing. This feature can also improve data line to data line noise immunity.

Using continuous sensing of data line current and determination of minima provides read settings that are dynamic and self-calibrating, reducing the use of tuning via characterization of the transistor of the memory cell. This feature can reduce chip complexity and time to market. The continuous read sensing setup on a NAND chip, provided by the use of minima of dI/dt, provides an internal signal to determine the optimum read point, which allows a system to automatically adjust to shifted and disturbed data.

In NAND memory devices, continuous sensing of data line current and determination of valley minima can be used for first pass and second pass applications without changes in read levels, even if a memory cell is in an intermediate state ($1^{st}$ pass of a $2^{nd}$ pass algorithm) or in a completed situation. Selecting the appropriate window and finding the associated minimum would result in return of the correct data, without specific trims defined for intermediate programing states. During programming operations, an internal preread process can use this continuous read sensing scheme to improve programming speed, which can reduce complexity.

In NAND memory devices using continuous sensing of data line current and determination of minima, read retry paths can be shortened because an internally provided signal is actively used to determine valley location. No specific offsets for data retention or cross temperature would be expected. Cross-temperature effect in a NAND memory device causes a shift in the cell VT in the NAND blocks, to the right or left, as a result of a temperature difference between the time of writing and the time of reading. Soft bit (SBR) information can be gathered during error handling reads easily, possibly resulting in shorter overhead for handling extra decode information.

Continuous sensing of data line current and determination of minima can remove constraints on placement of distributions at the same point for all access lines. With this continuous sensing, the read process keys off an internal signal so substantial variation in valley location can be targeted without adverse effects on trigger rate. This creates an additional degree of freedom when creating a read window budget. This can result in less effort to optimize a NAND memory device and better time to market.

Implementing an embodiment of this feature of continuous sensing of data line current and determining minima can allow for multiple pages to be read with a single ramp, which can be applied to conducting single pass TLC programming. An expectation is that use of an access line ramp would take less time than the typical settle time for a single read. This feature can also allow for multiplane page reads of different pages without having the extra overhead of separate power supplies for independent access line excitation. Having the ability to set WL voltage independently on each plane (IWR) would allow separate calibrated levels to be driven for error handling reads, which are expected to sweep and actively seek minima at a much slower rate but can reduce or eliminate use for reading different pages on different planes.

Embodiments of a continuous read sensing scheme, as taught herein, should be able to substantially speed up read time. This speed up can be performed by aggressively ramping the voltage on the selected access line and sampling the data line current monitored by the current sensor mechanism at a high frequency. There is likely a raw bit error rate (RBER) difference for using dynamic vs. near static read values that can be evaluated during implementation. Read speed can be slowed down and actively seeking minimum values can be conducted to obtain best-in-class read level calibration. Voltage applied to selected access lines WLs, as an access line ramp voltage, can be used to control the speed of measurement.

In various embodiments, the current sensor mechanism to capture all of the string current provides an easy way to collect histogram data. This data can be used as an indicator of health of the memory device, which can be used directly to debug the memory device from saving and reporting VT profile, for example, or can be used to more completely characterize the transient behaviour during qualification. This data can be used in media management algorithms to determine data health in a continuous read sensing scheme as taught herein. Valley depth or shape can be used as an indicator of data health. For example, the shape of values in FIG. 12, that is, the slope of the curve 1206 around the minima 1202-1, 1202-2, 1202-3, 1202-4, 1202-5, 1205-6, and 1202-7 of dI/dt.

Resistance-capacitance (RC) of an access line WL can distort the valley by having bits at the end of the WL have slightly out of phase behavior due to different applied voltages at the beginning and end of the WL. Access line RC has strong temperature dependency for which compensation may be applied. Significant flexibility in the applied WL voltage can help mitigate RC issues, such as adjusting the applied slope in the example process 300 of FIG. 3 to match the new RC constant. Non-linear applications can also be used for processes of applying the WL voltage. Aggregate bitline current waveform can be compared with the WL applied waveform to analyze phase differences and potentially change the applied WL waveform to compensate. The summation circuit, provided by a current sensing mechanism, can monitor the bit levels and capture the data when the expected bit count is sensed. Common mode noise rejection mechanisms can help with most shifts in the NAND system. An exception to this would be changes in applied voltage on the access line across data lines. Since the selected WL value is not stabilized, different voltages applied on one side of the data line array to the other can result in different turn-on timing and possible bit errors for marginal bits. The continuous sensing scheme should not be sensitive to applied variation in access line voltage outside of data line to data line variation. Voltage drop on the access line before getting to a plane for a selector gate would be accounted for with common mode rejection and self-adjustment of the read point to align with the delay in appearance of the valley.

With respect to error handling, a starting point for error handling flow can be the point of minimum current change (dI/dt) on initial read. Offsets or other read points can be referenced to this initial read.

Figure 13:
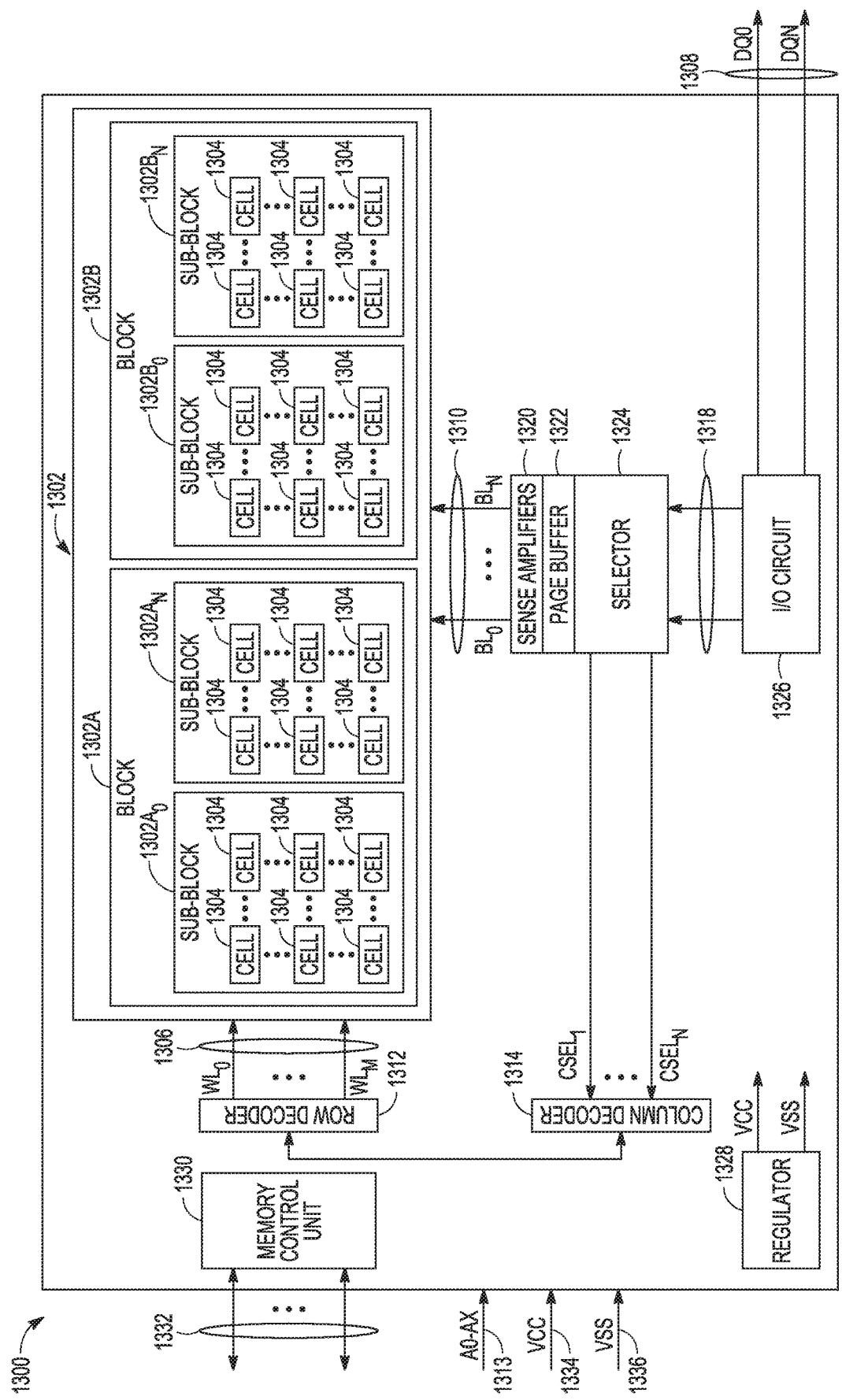
FIG. 13 illustrates a functional block diagram of an example memory device, according to various embodiments.

FIG. 13 illustrates a functional block diagram of an example memory device 1300 including a memory array 1302 having a plurality of memory cells 1304, and one or more circuits or components to provide communication with, or perform one or more memory operations on, the memory array 1302. The memory device 1300 can include a row decoder 1312, a column decoder 1314, sense amplifiers 1320, a page buffer 1322, a selector 1324, an I/O circuit 1326, and a memory control unit 1330. The memory device 1300 can be structured to execute a continuous sensing scheme to determine read levels during a read process. The memory control unit 1330 in addition to controlling common operating functions of the memory device 1300 can be structured to control continuous sensing of total data line current and determination of the minima of the total data line current similar to the memory controller 231 of FIG. 2. The memory control unit 1330 can be implemented to execute schemes to determine the minima of the total data line current and to generate latch signals at appropriate times to capture data in read processes of the memory device 1300, in accordance with schemes as taught herein. A current sensor can be implemented with the sense amplifiers 1320 to sense the total current associated with groups of data lines BL0 . . . BLN, similar to current sensor 210 of FIG. 2.

The memory cells 1304 of the memory array 1302 can be arranged in blocks, such as first and second blocks 1302A, 1302B. Each block can include sub-blocks. For example, the first block 1302A can include first and second sub-blocks $1302A_0$, $1302A_N$, and the second block 1302B can include first and second sub-blocks $1302B_0$, $1302B_N$. Each sub-block can include a number of physical pages, with each page including a number of memory cells 1304. Although illustrated herein as having two blocks, with each block having two sub-blocks, and each sub-block having a number of memory cells 1304, in other examples, the memory array 1302 can include more or fewer blocks, sub-blocks, memory cells, etc. In other examples, the memory cells 1304 can be arranged in a number of rows, columns, pages, sub-blocks, blocks, etc., and accessed using, for example, access lines 1306, first data lines 1310, or one or more select gates, source lines, etc.

The memory control unit 1330 can control memory operations of the memory device 1300 according to one or more signals or instructions received on control lines 1332, including, for example, one or more clock signals or control signals that indicate a desired operation (e.g., write, read, erase, etc.), or address signals (A0-AX) received on one or more address lines 1316. One or more devices external to the memory device 1300 can control the values of the control signals on the control lines 1332 or the address signals on the address line 1316. Examples of devices external to the memory device 1300 can include, but are not limited to, a host, a memory controller, a processor, or one or more circuits or components not illustrated in FIG. 13.

The memory device 1300 can use access lines 1306 and first data lines 1310 to transfer data to (e.g., write or erase) or from (e.g., read) one or more of the memory cells 1304. The row decoder 1312 and the column decoder 1314 can receive and decode the address signals (A0-AX) from the address line 1316, can determine which of the memory cells 1304 are to be accessed, and can provide signals to one or more of the access lines 1306 (e.g., one or more of a plurality of access lines ($WL_0$-$WL_M$)) or the first data lines 1310 (e.g., one or more of a plurality of data lines (BL0-BLN)), such as described above.

The memory device 1300 can include sense circuitry, such as the sense amplifiers 1320, configured to determine the values of data on (e.g., read), or to determine the values of data to be written to, the memory cells 1304 using the first data lines 1310. For example, in a selected string of memory cells 1304, one or more of the sense amplifiers 1320 can read a logic level in the selected memory cell 1304 in response to a read current flowing in the memory array 1302 through the selected string associated with the data lines 1310.

One or more devices external to the memory device 1300 can communicate with the memory device 1300 using the I/O lines (DQ0-DQN) 1308, address lines 1316 (A0-AX), or control lines 1332. The I/O circuit 1326 can transfer values of data in or out of the memory device 1300, such as in or out of the page buffer 1322 or the memory array 1302, using the I/O lines 1308, according to, for example, the control lines 1332 and address lines 1316. The page buffer 1322 can store data received from the one or more devices external to the memory device 1300 before the data is programmed into relevant portions of the memory array 1302, or can store data read from the memory array 1302 before the data is transmitted to the one or more devices external to the memory device 1300.

The column decoder 1314 can receive and decode address signals (A0-AX) into one or more column select signals ($CSEL_1$-$CSEL_N$). The selector 1324 (e.g., a select circuit) can receive the column select signal s ($CSEL_1$-$CSEL_N$) and select data in the page buffer 1322 representing values of data to be read from or to be programmed into memory cells 1304. Selected data can be transferred between the page buffer 1322 and the I/O circuit 1326 using second data lines 1318.

The memory control unit 1330 can receive positive and negative supply signals, such as a supply voltage (Vcc) 1334 and a negative supply (Vss) 1336 (e.g., a ground potential) with respect to Vcc, from an external source or supply (e.g., an internal or external battery, an AC-to-DC converter, etc.). In certain examples, the memory control unit 1330 can include a regulator 1328 to internally provide positive or negative supply signals.

Figure 14:
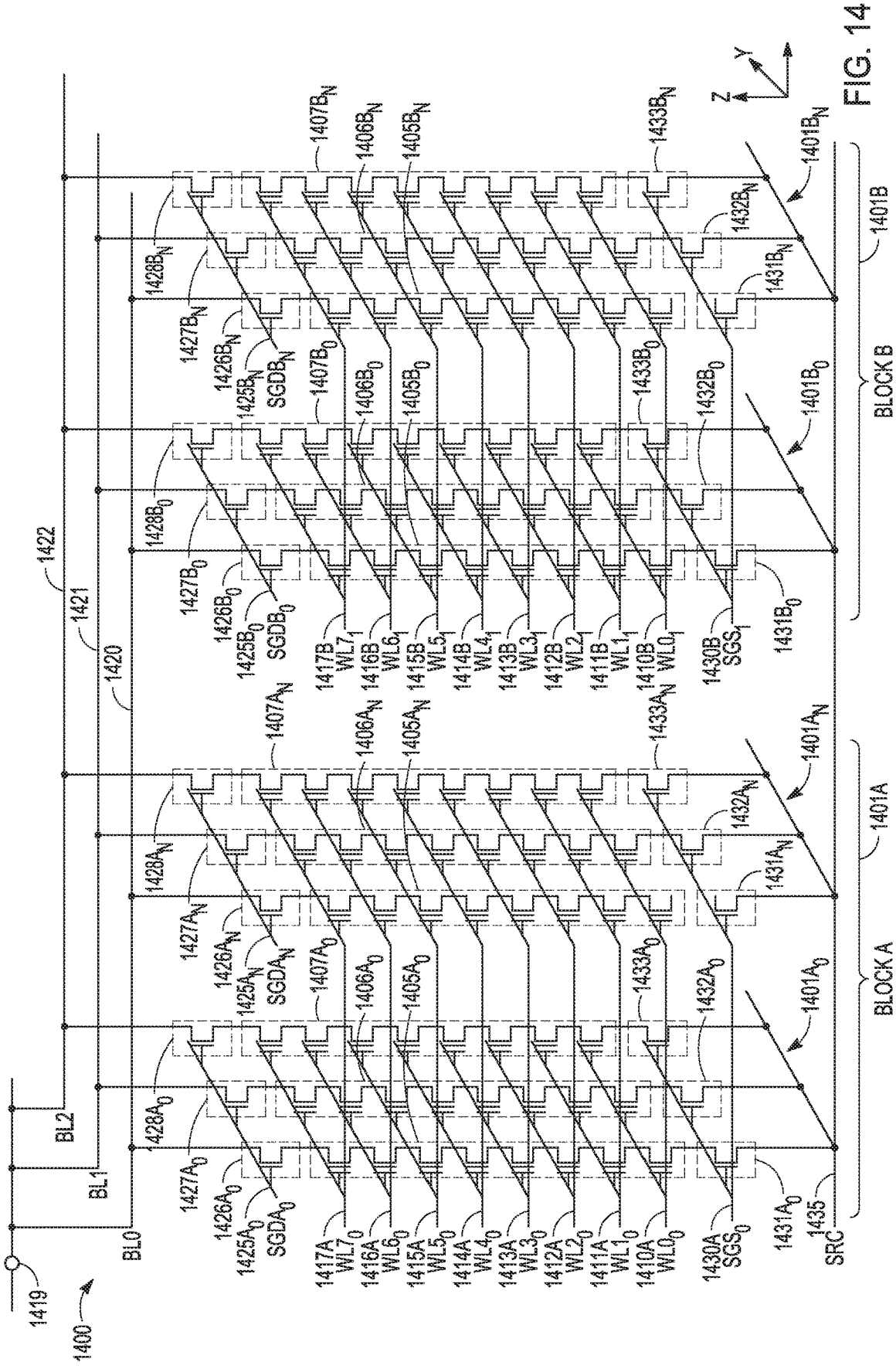
FIGS. 14 and 15 illustrate schematic diagrams of three-dimensional NAND architecture semiconductor memory arrays with data lines coupled to a current sensor, according to various embodiments.

FIG. 14 illustrates an example schematic diagram of a 3D NAND architecture semiconductor memory array 1400 with data lines BL0, BL1, and BL2 coupled to a current sensor 1419. Though three data lines are shown, the number of data lines coupled to the current sensor 1419 can be greater than or less than three data lines. The 3D NAND architecture semiconductor memory array 1400 can include a number of strings of memory cells (e.g., first-third $A_0$ memory strings $1405A_0$-$1407A_0$, first-third $A_n$ memory strings $1405A_n$-$1407A_n$, first-third $B_0$ memory strings $1405B_0$-$1407B_0$, first-third $B_n$ memory strings $1405B_n$-$1407B_n$, etc.), organized in blocks (e.g., block A 1401A, block B 1401B, etc.) and sub-blocks (e.g., sub-block $A_0$ $1401A_0$, sub-block $A_n$ $1401A_n$, sub-block $B_0$ $1401B_0$, sub-block $B_n$ $1401B_n$, etc.). The memory array 1400 represents a portion of a number of similar structures that would typically be found in a block, device, or other unit of a memory device.

Each string of memory cells includes a number of tiers of charge storage transistors (e.g., floating gate transistors, charge-trapping structures, etc.) stacked in the Z direction, source to drain, between a source line (SRC) 1435 or a source-side select gate (SGS) (e.g., first-third $A_0$ SGS $1431A_0$-$1433A_0$, first-third $A_n$ SGS $1431A_n$-$1433A_n$, first-third $B_0$ SGS $1431B_0$-$1433B_0$, first-third $B_n$ SGS $1431B_n$-$1433B_n$, etc.) and a drain-side select gate (SGD) (e.g., first-third $A_0$ SGD $1426A_0$-$1428A_0$, first-third $A_n$ SGD $1426A_n$-$1428A_n$, first-third $B_0$ SGD $1426B_0$-$1428B_0$, first-third $B_n$ SGD $1426B_n$-$1428B_n$, etc.). Each string of memory cells in the 3D memory array 1400 can be arranged along the X direction as data lines (e.g., data lines BL0-BL2 1420-1422), and along the Y direction as physical pages.

Within a physical page, each tier represents a row of memory cells, and each string of memory cells represents a column. A sub-block can include one or more physical pages. A block can include a number of sub-blocks (or physical pages) (e.g., 128, 256, 384, etc.). Although illustrated herein as having two blocks, with each block having two sub-blocks, each sub-block having a single physical page, each physical page having three strings of memory cells, and each string having 8 tiers of memory cells, in other examples, the memory array 1400 can include more or fewer blocks, sub-blocks, physical pages, strings of memory cells, memory cells, or tiers. For example, each string of memory cells can include more or fewer tiers (e.g., 16, 32, 64, 128, etc.), as well as one or more additional tiers of semiconductor material above or below the charge storage transistors (e.g., select gates, data lines, etc.), as desired. As an example, a 48 GB TLC NAND memory device can include 18,592 bytes (B) of data per page (16,384+2208 bytes), 1536 pages per block, 548 blocks per plane, and 4 or more planes per device.

Each memory cell in the memory array 1400 includes a control gate (CG) coupled to (e.g., electrically or otherwise operatively connected to) an access line (e.g., access lines $WL0_0$-$WL7_0$ 1410A-1417A, $WL0_1$-$WL7_1$ 1410B-1417B, etc.), which collectively couples the control gates (CGs) across a specific tier, or a portion of a tier, as desired. Specific tiers in the 3D memory array 1400, and accordingly, specific memory cells in a string, can be accessed or controlled using respective access lines. Groups of select gates can be accessed using various select lines. For example, first-third $A_0$ SGD $1426A_0$-$1428A_0$ can be accessed using an $A_0$ SGD line $SGDA_0$ $1425A_0$, first-third $A_n$ SGD $1426A_n$-$1428A_n$ can be accessed using an $A_n$ SGD line $SGDA_n$ $1425A_n$, first-third $B_0$ SGD $1426B_0$-$1428B_0$ can be accessed using a $B_0$ SGD line $SGDB_0$ $1425B_0$, and first-third $B_n$ SGD $1426B_n$-$1428B_n$ can be accessed using a $B_n$ SGD line $SGDB_n$ $1425B_n$. First-third $A_0$ SGS $1431A_0$-$1433A_0$ and first-third $A_n$ SGS $1431A_n$-$1433A_n$ can be accessed using a gate select line $SGS_0$ 1430A, and first-third $B_0$ SGS $1431B_0$-$1433B_0$ and first-third $B_n$ SGS $1431B_n$-$1433B_n$ can be accessed using a gate select line $SGS_1$ 1430B.

In an example, the memory array 1400 can include a number of levels of semiconductor material (e.g., polysilicon, etc.) configured to couple the CGs of each memory cell or select gate (or a portion of the CGs or select gates) of a respective tier of the memory array 1400. Specific strings of memory cells in the memory array 1400 can be accessed, selected, or controlled using a combination of data lines and select gates, etc., and specific memory cells at one or more tiers in the specific strings can be accessed, selected, or controlled using one or more access lines.

In various embodiments, a read process of the memory array 1400 can be implemented using a continuous sensing of total data line current by the current sensor 1419 and determination of the minima of the total data line current similar to the scheme associated with FIG. 2. The current sensor 1419 can sense the total current in a group of data lines such as BL0 1420, BL1 1421, and BL2 1422 as a non-limiting group of data lines corresponding to an access line selected for reading. The total data line current or values of the total current monitored by the current sensor 1419 can be provided to a memory controller (not shown here for ease of discussion of the memory array 1400), similar to the memory controller 231 of FIG. 2, to execute schemes to determine the minima of the total data line current and to generate latch signals at appropriate times to capture data in read processes of the memory device 1400, in accordance with schemes as taught herein.

Figure 15:
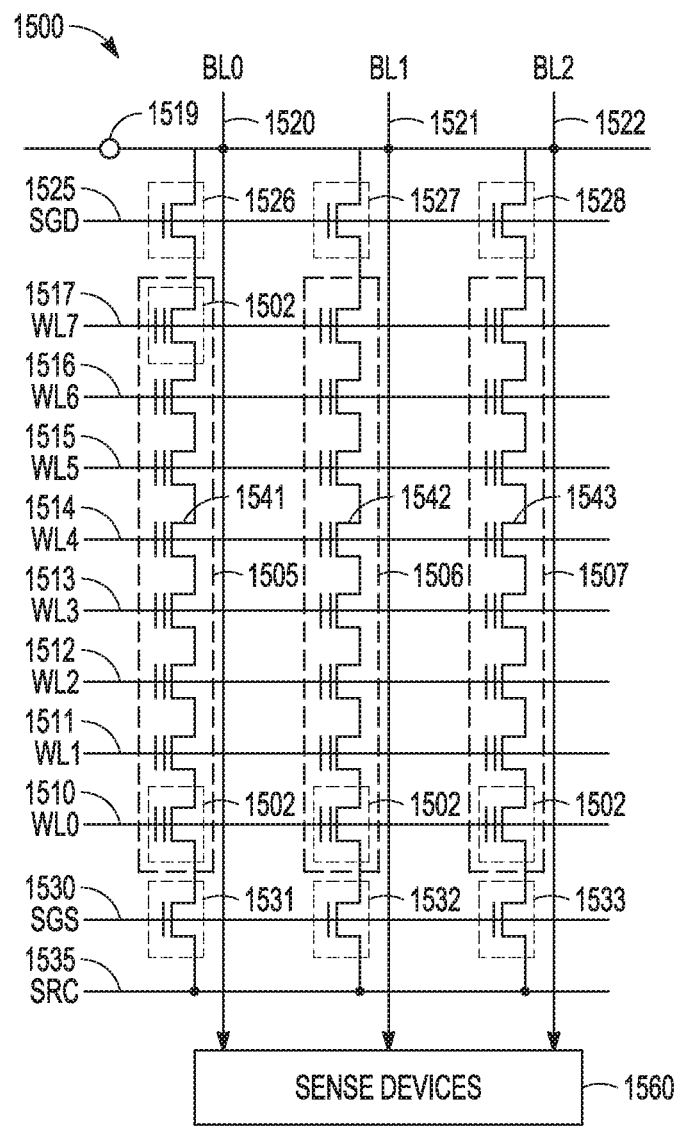

FIG. 15 illustrates an example schematic diagram of a portion of a NAND architecture semiconductor memory array 1500 with data lines BL0, BL1, and BL2 coupled to a current sensor 1519. Though three data lines are shown, the number of data lines coupled to the current sensor 1519 can be greater than or less than three data lines. The portion of the NAND architecture semiconductor memory array 1500 can include a plurality of memory cells 1502 arranged in a three-dimensional (2D) array of strings (e.g., first-third strings 1505-1507) and tiers (e.g., illustrated as respective access lines (WL) WL0-WL7 1510-1517, a drain-side select gate (SGD) line 1525, a source-side select gate (SGS) line 1530, etc.), and sense amplifiers or devices 1560. For example, the memory array 1500 can illustrate an example schematic diagram of a portion of one physical page of memory cells of a 3D NAND architecture semiconductor memory device, such as illustrated in FIG. 14.

Each string of memory cells is coupled to a source line (SRC) 1535 using a respective source-side select gate (SGS) (e.g., first-third SGS 1531-1533), and to a respective data line (e.g., first-third data lines BL0-BL2 1520-1522) using a respective drain-side select gate (SGD) (e.g., first-third SGD 1526-1528). Although illustrated with 8 tiers (e.g., using access lines WL0-WL7 1510-1517) and three data lines (BL0-BL2 1526-1528) in the example of FIG. 15, other examples can include strings of memory cells having more or fewer tiers or data lines, as desired.

In a NAND architecture semiconductor memory array, such as the example memory array 1500, the state of a selected memory cell 1502 can be accessed by sensing a current or voltage variation associated with a particular data line containing the selected memory cell. The memory array 1500 can be accessed (e.g., by a control circuit, one or more processors, digital logic, etc.) using one or more drivers. In an example, one or more drivers can activate a specific memory cell, or set of memory cells, by driving a particular potential to one or more data lines (e.g., data lines BL0-BL2), access lines (e.g., access lines WL0-WL7), or select gates, depending on the type of operation desired to be performed on the specific memory cell or set of memory cells.

To program or write data to a memory cell, a programming voltage (Vpgm) (e.g., one or more programming pulses, etc.) can be applied to selected access lines (e.g., WL4), and thus, to a control gate of each memory cell coupled to the selected access lines (e.g., first-third CGs 1541-1543 of the memory cells coupled to WL4). Programming pulses can begin, for example, at or near 15V, and, in certain examples, can increase in magnitude during each programming pulse application. While the program voltage is applied to the selected access lines, a potential, such as a ground potential (e.g., Vss), can be applied to the data lines and substrates (and thus the channels, between the sources and drains) of the memory cells targeted for programming, resulting in a charge transfer (e.g., direct injection or Fowler-Nordheim (FN) tunneling, etc.) from the channels to the floating gates of the targeted memory cells.

In contrast, a pass voltage (Vpass) can be applied to one or more access lines having memory cells that are not targeted for programming, or an inhibit voltage (e.g., Vcc) can be applied to data lines having memory cells that are not targeted for programming, for example, to inhibit charge from being transferred from the channels to the floating gates of such non-targeted memory cells. The pass voltage can be variable, depending, for example, on the proximity of the applied pass voltages to an access line targeted for programming. The inhibit voltage can include a supply voltage (Vcc), such as a voltage from an external source or supply (e.g., a battery, an AC-to-DC converter, etc.), relative to a ground potential (e.g., Vss).

As an example, if a programming voltage (e.g., 15V or more) is applied to a specific access line, such as WL4, a pass voltage of 10V can be applied to one or more other access lines, such as WL3, WL5, etc., to inhibit programming of non-targeted memory cells, or to retain the values stored on such memory cells not targeted for programming. As the distance between an applied program voltage and the non-targeted memory cells increases, the pass voltage required to refrain from programming the non-targeted memory cells can decrease. For example, where a programming voltage of 15V is applied to WL4, a pass voltage of 10V can be applied to WL3 and WL5, a pass voltage of 8 V can be applied to WL2 and WL6, a pass voltage of 7V can be applied to WL1 and WL7, etc. In other examples, the pass voltages, or number of access lines, etc., can be higher or lower, or more or less.

Between applications of one or more programming pulses (e.g., Vpgm), a verify operation can be performed to determine if a selected memory cell has reached its intended programmed state. If the selected memory cell has reached its intended programmed state, it can be inhibited from further programming. If the selected memory cell has not reached its intended programmed state, additional programming pulses can be applied. If the selected memory cell has not reached its intended programmed state after a particular number of programming pulses (e.g., a maximum number), the selected memory cell, or a string, block, or page associated with such selected memory cell, can be marked as defective.

To erase a memory cell or a group of memory cells (e.g., erasure is typically performed in blocks or sub-blocks), an erasure voltage (Vers) (e.g., typically Vpgm) can be applied to the substrates (and thus the channels, between the sources and drains) of the memory cells targeted for erasure (e.g., using one or more data lines, select gates, etc.), while the access lines of the targeted memory cells are kept at a potential, such as a ground potential (e.g., Vss), resulting in a charge transfer (e.g., direct injection or FN tunneling, etc.) from the floating gates of the targeted memory cells to the channels.

In various embodiments, a read process of the memory array 1500 can be implemented using a continuous sensing of total data line current by the current sensor 1519 and determination of the minima of the total data line current similar to the scheme associated with FIG. 2. The current sensor 1519 can sense the total current in a group of data lines such as BL0 1520, BL1 1521, and BL2 1522, as a non-limiting of data lines, corresponding to an access line selected for reading. The total data line current or values of the total current monitored by the current sensor 1519 can be provided to a memory controller (not shown here for ease of discussion of the memory array 1500), similar to the memory controller 231 of FIG. 2, to execute schemes to determine the minima of the total data line current and to generate latch signals at appropriate times to capture data in read processes of the memory device 1500, in accordance with schemes as taught herein. The sense amplifiers or devices 1560 coupled to one or more of the data lines (e.g., first, second, or third data lines (BL0-BL2) 1520-1522), can detect the state of each memory cell in respective data lines by sensing a voltage or current on a particular data line in conjunction with the memory controller generating latch signals to sense latches of the sense amplifiers or devices 1560 at the appropriate times to capture the data.

Figure 16:
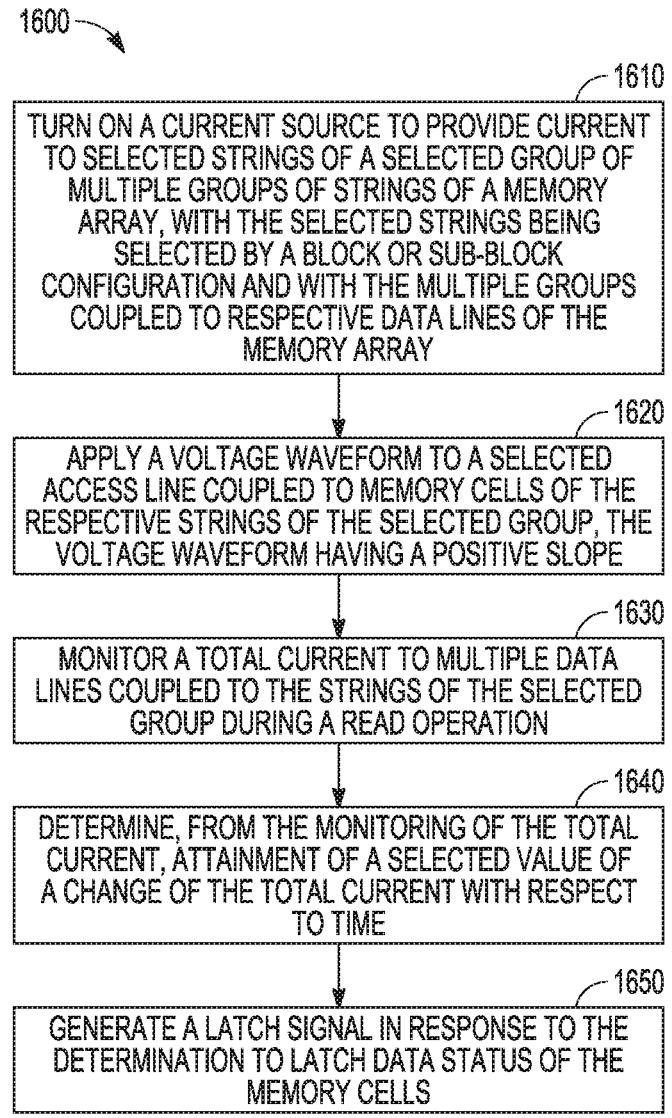
FIG. 16 is a flow diagram of features of an example method of a reading process of a memory device, according to various embodiments.

FIG. 16 is a flow diagram of features of an embodiment of an example method 1600 of a reading process of a memory device. At 1610, a current source is turned on to provide current to selected strings of a selected group of multiple groups of strings of a memory array, with the selected strings being selected by a block or sub-block configuration and with the multiple groups coupled to respective data lines of the memory array. At 1620, a voltage waveform is applied to a selected access line coupled to memory cells of the respective strings of the selected group, with the voltage waveform having a positive slope. The voltage waveform can be applied as a linear ramp signal or as a non-linear signal.

At 1630, a total current to multiple data lines coupled to the strings of the selected group is monitored during a read operation. The monitoring of the total current can include reading output of a current sensor at multiple locations in time. The total current can be monitored continuously over a selected period with sampling at the multiple locations within the period. The monitoring can be constant as with an analog circuit or can be discrete with digital signal processing. The memory device can measure multiple points with the read operation to monitor, process, and react to an incoming data stream.

At 1640, from the monitoring of the total current, attainment of a selected value of a change of the total current with respect to time is determined. At 1650, a latch signal is generated, in response to the determination, to latch data status of the memory cells. Determining the attainment of the selected value can include determining a difference between a measured value of the total current and a previous measured value of the total current for multiple iterations of measured values and previous measured values; and determining a minimum difference of the determined differences of the multiple iterations. Generating the latch signal can include generating the latch signal at a time corresponding to the minimum difference adjusted by a time corresponding to an offset.

Variations of the method 1600 or methods similar to the method 1600 can include a number of different embodiments that may be combined depending on the application of such methods or the architecture or process flow of a memory device for which such methods are implemented. Such methods can include, prior to applying the voltage waveform to the selected access line, conducting the turning on of the current source, and applying on-voltages to access lines, other than the selected access line, coupled to the strings of the selected group and on-voltages to select gates of the strings of the selected group.

Variations of the method 1600 or methods similar to the method 1600 can include determining a current offset value to provide the latch signal for latching the data status of the memory cell. Data of the data status of the memory cells can be moved from sense latches by a next read point, with the next read point based on detecting a next attainment of a next selected value of a next change of the total current with respect to time.

In various embodiments, data status of the memory cells are latched based on a determination of a minimum value of a change of the total current with respect to time. The determination of the minimum value can include, but is not limited to, determining a difference between a measured value of the total current and a previous measured value of the total current for multiple iterations of measured values and previous measured values, and determining a minimum difference of the determined differences of the multiple iterations. Other techniques can be implemented to determine the minimum value of a change of the total current with respect to time. A latch signal can be generated to latch the data status of the memory cells at a time corresponding to the minimum difference adjusted by a time corresponding to an offset. This process provides for valley finding in programmed state distribution by using data line current summation as an indicator. From a mathematical perspective, this can be attained by finding the minimum of the rate of change for the signal provided by monitoring cumulative data line current. Such a signal can be used to find optimum read points.

In various embodiments, a memory device comprises a memory array, a current sensor, a memory controller, and sense latches. The memory array has multiple groups of strings of memory cells, where the multiple groups are coupled to respective data lines of the memory array. The current sensor is structured to measure total current to the respective data lines coupled to a group of the groups of strings. The memory controller includes processing circuitry including one or more processors, where the memory controller is configured to perform operations with respect to a read operation. The operations comprise: monitoring the total current to the respective data lines coupled to the group during a read operation, the read operation including applying a voltage waveform having a positive slope to a selected access line; determining, from the monitoring of the total current, attainment of a selected value of a change of the total current with respect to time; and generating a latch signal in response to the determination. The sense latches are coupled to the respective data lines coupled to the group to capture data status in the read operation in response to receiving the latch signal. The memory device can include one or more storage elements to store a value of an offset, where the offset is used with a minimum value of a change of the total current with respect to time to generate the latch signal.

Variations of such a memory device and its features, as taught herein, can include a number of different embodiments and features that may be combined depending on the application of such memory devices, the format of such memory devices, and/or the architecture in which such memory devices are implemented. Components of such memory devices can include a waveform generator to apply a voltage waveform to a selected access line coupled to memory cells of respective strings of the group of the groups of strings such that the memory cells are included in the capture of data status. The waveform generator is operable to apply a linear voltage waveform. In some embodiments, the waveform generator is operable to apply a non-linear waveform to the selected access line. The waveform can be implemented as a function of the memory controller.

Variations of such a memory device can include the memory device including one or more storage elements to store measured values of the total current and differences between measured values of the total current and previous measured values of the total current. Each difference between a measured value of the total current and a previous measured value can be generated as a difference between a respective measured value of the total current and a last measured value relative to the respective measured value. Variations of such a memory device can include the memory device having one or more circuits to determine the differences between the measured values of the total current and the previous measured values of the total current and to determine a minimum difference from the determined differences between measured values and previous measured values. The one or more circuits can be implemented as functions of the memory controller.

Variations of such a memory device can include variations of the current sensor to continuously monitor the total current to the respective data lines of the group associated with the read of data based on a determination of a minimum value of a change of the total current with respect to time. A current sensor implemented can include a counter to count a number of charges or discharges associated with a charge pump used in providing the current. A current sensor implemented can include a resistance coupled between a voltage supply and a node to which the respective data lines of the group are coupled. The resistance is coupled to an amplifier with one end of the resistance coupled to an input of the amplifier and the other end of the resistance coupled to another input of the amplifier and with an output of the amplifier coupled to a digital-to-analog converter. A current sensor implemented can include the current sensor structured as a non-contact sensor that senses flux caused by flowing current.

In various embodiments, a memory device comprises a memory array, a current sensor, a current source, a memory controller, and sense latches. The memory array has multiple groups of strings of memory cells, where the multiple groups are coupled to respective data lines of the memory array. The current sensor is structured to measure total current to the respective data lines couple to a group of the groups of strings. The current source is arranged to provide current to the strings of the group. The memory controller includes processing circuitry including one or more processors, where the memory controller is configured to perform operations in a read operation. The operations comprise: turning on the current source with the respective data lines coupled to the group in a non-conducting state; applying a ramp voltage to a selected access line coupled to memory cells of the strings of the group; monitoring the total current to the respective data lines coupled to the group; determining, from the monitoring of the total current, a minimum value of a change of the total current with respect to time; and generating a latch signal in response to the determination. The sense latches are coupled to the respective data lines coupled to the group to capture data status in the read operation in response to receiving the latch signal.

Variations of such a memory device and its features, as taught herein, can include a number of different embodiments and features that may be combined depending on the application of such memory devices, the format of such memory devices, and/or the architecture in which such memory devices are implemented. Variations of such memory devices can include the memory controller being operable to execute generation of the latch signal at a time corresponding to the minimum value of the change of the total current with respect to time adjusted by a time corresponding to an offset. Variations of the memory device can include the memory controller being operable to execute instructions to determine a value of the offset.

In various embodiments, a continuous sensing scheme, using current sensing of a group of data lines associated with memory cells of an memory array being read, can improve the time to read data from a NAND memory device. This continuous sensing scheme would increase the ability to read multiple read points in a short period of time. This can be important for MLCs such as DLCs, TLCs, QLCs, and PLCs. This continuous sensing scheme or similar sensing scheme also could have positive impact for sequential data reads on single pass programming architectures, where contiguous data may reside on multiple read levels in a physical location. Because this continuous sensing scheme is expected to allow for multiple read levels to be read more efficiently, reading an upper page and lower page in appropriate memory architectures can be possible and can be delivered faster.

A system, implementing a continuous sensing scheme using current sensing of a group of data lines as taught herein, can remove the use of procedures to predict read levels within the NAND memory device. Existing compensation schemes to keep the memory device in calibration can be reduced or eliminated in use, which such reduction or elimination provides a substantial simplification of the read process. This also reduces software complexity and FW implementation time in the system. Since the continuous sensing scheme using current sensing, as taught herein, calibrates on each individual physical pages, algorithm errors associated with the compensation schemes reduced or eliminated will no longer be pertinent. This would result in an improvement in trigger rates for reads where the media has settled. Each read level in the continuous sensing scheme effectively has been tuned to reflect ideal convergence based on the bit signal without an increase in read time.

Continuous sensing scheme using current sensing of a group of data lines associated with memory cells of a memory array being read and determining minima of the total current of the group to capture read points provide a feedback mechanism to dynamically adjust to changes in distribution of programmed states of the memory cells. This means that movements in VTs will automatically be accounted for, resulting in optimum read performance. This system would maintain good trigger rate performance even in situations where part of the media had significant data retention or change throughout the life of the memory device. In addition, VT placement does not have to be consistent from memory cell to memory cell or access line to access line, which provides for more operational flexibility. With lower trigger rate, lower system complexity can be attained. Reduced complexity may be attained by reduced or eliminated management of read levels, access line gain, or tempcos. Since all reads are internally calibrated within each read, different levels of data retention and charge loss would not result in increased latency. Use of one or more additional schemes to predict changes in VT levels due to program erase cycles can be avoided. Such avoided schemes can include schemes for tempco changes by PEC, where PEC is the total programming and erase (P/E) cycle endurance of each flash block, that is, the number of P/E cycles the block can sustain before its raw error rate exceeds the error-correcting code (ECC) correction capability. This can be especially important for replacement gate NAND memory devices, where the VT levels can move more throughout the life of the memory device.

In various embodiments, a continuous sensing scheme using feedback to determine read levels during a read process makes use of a summation of all data line current for the read of memory cells corresponding to a selected access line in the read process as an indicator of different system conditions. Use signal processing of this summation signal to determine read points is made to drive simplification and optimization of the read process. Applications for this extracted current summation signal include dynamic read level determination, provision for data line or selector settling time, and margin evaluation, where margin evaluation provides a determination of how deep and spaced are the valleys of the distributions of programmed states.

In contrast to a conventional NAND memory device that is effectively an open loop system, implementations of a continuous sensing scheme in a NAND memory device makes such an enhanced NAND memory device into a system that is feedback driven. The result of this feedback driven status provides that many of the shift mechanisms observed in the NAND memory device would be calibrated out in the read path. RC parameters of access lines and data lines can be measured using this approach and all valley movement could be calibrated in line and effectively removed or substantially reduced. Embodiments of a continuous sensing approach, as taught herein, should be viable for all page-based (multiple returned bits) systems for each memory selection.

Electronic devices, such as mobile electronic devices (e.g., smart phones, tablets, etc.), electronic devices for use in automotive applications (e.g., automotive sensors, control units, driver-assistance systems, passenger safety or comfort systems, etc.), and Internet-connected appliances or devices (e.g., Internet-of-Things (IoT) devices, etc.), have varying storage needs depending on, among other things, the type of electronic device, use environment, performance expectations, etc.

Electronic devices can be broken down into several main components: a processor (e.g., a central processing unit (CPU) or other main processor); memory (e.g., one or more volatile or non-volatile RAM memory device, such as DRAM, mobile or low-power double-data-rate synchronous DRAM (DDR SDRAM), etc.); and a storage device (e.g., non-volatile memory (NVM) device, such as flash memory, ROM, an SSD, an MMC, or other memory card structure or assembly, etc.). In certain examples, electronic devices can include a user interface (e.g., a display, touch-screen, keyboard, one or more buttons, etc.), a graphics processing unit (GPU), a power management circuit, a baseband processor or one or more transceiver circuits, etc.

Figure 17:
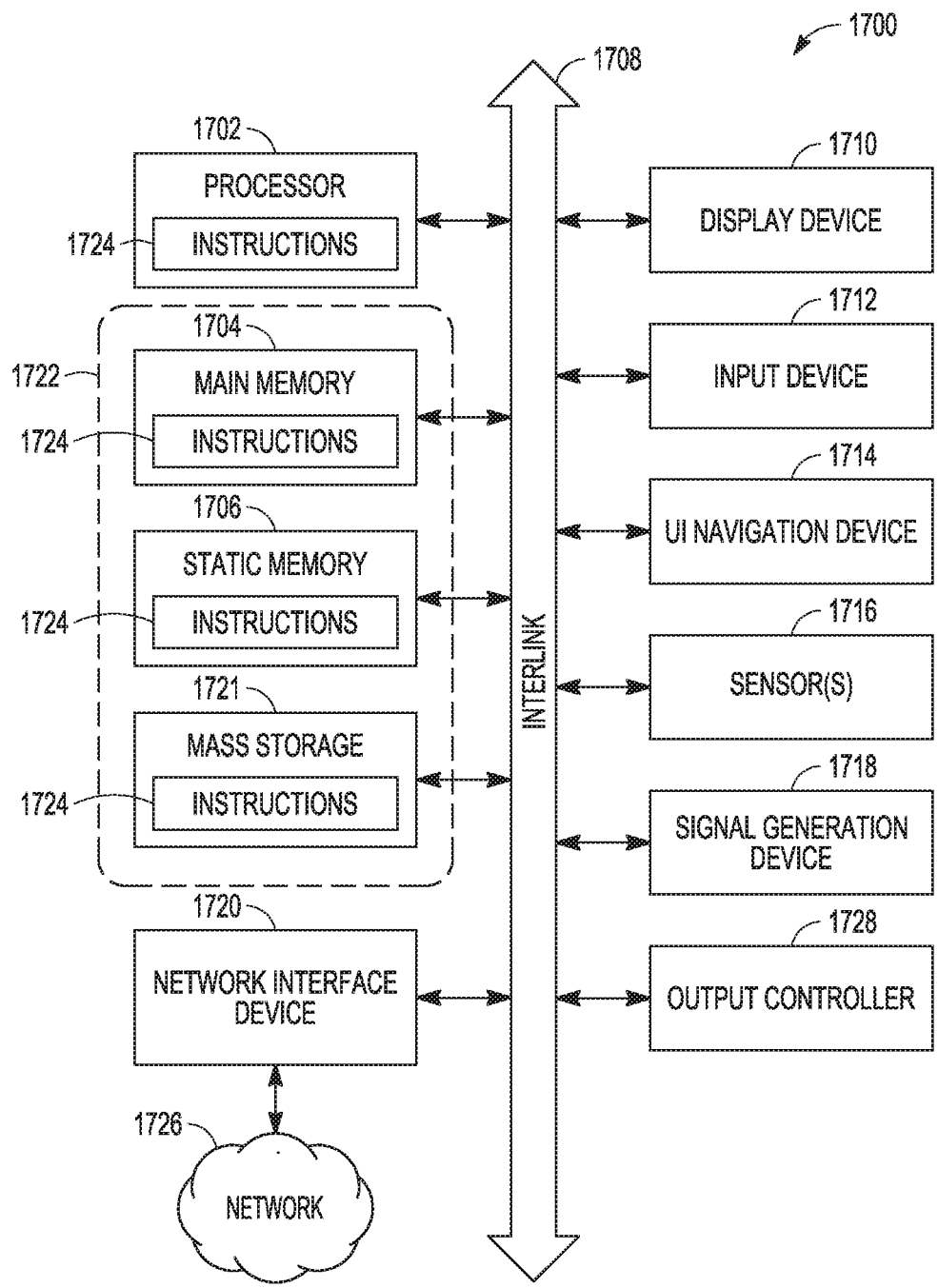
FIG. 17 illustrates a block diagram of an example machine having one or more memory devices structured to perform continuous sensing to determine read levels during a read process, according to various embodiments.

FIG. 17 illustrates a block diagram of an example machine 1700 having one or more memory devices structured to perform continuous sensing to determine read levels during a read process. Such memories can include a current sensor to continuously sense the total current to a group of data lines of a memory array, where the data lines are coupled to respective strings of memory cells of the memory array. The total current is sensed with a selected access line to memory cells of the respective strings subjected to an applied voltage waveform for reading data of the memory cells. A microcontroller, such as a memory controller of the memory device, executes procedures to determine a minimum of the time derivative of the total current and generates a latch signal to sense latches coupled to the data lines of the group at an appropriate time in response to the determination of the minimum. The machine 1700, having one or more such memory devices, may operate as a standalone machine or may be connected, for example networked, to other machines.

In a networked deployment, the machine 1700 may operate in the capacity of a server machine, a client machine, or both in server-client network environments. In an example, the machine 1700 may act as a peer machine in peer-to-peer (P2P) (or other distributed) network environment. The machine 1700 may be a personal computer (PC), a tablet PC, a set-top box (STB), a personal digital assistant (PDA), a mobile telephone, a web appliance, an IoT device, automotive system, or any machine capable of executing instructions (sequential or otherwise) that specify actions to be taken by that machine. Further, while only a single machine is illustrated, the term "machine" shah also be taken to include any collection of machines that individually or jointly execute a set (or multiple sets) of instructions to perform any one or more of the methodologies discussed herein, such as cloud computing, software as a service (SaaS), other computer cluster configurations. The example machine 1700 can be arranged to operate with one or more memory devices having a structure to perform continuous sensing to determine read levels during a read process as taught herein. The example machine 1700 can include one or more memory devices having structures as discussed with respect to the architecture of FIG. 2, the memory device 1300 of FIG. 13, the memory array 1400 of FIG. 14, and the memory array 1500 of FIG. 15.

Examples, as described herein, may include, or may operate by, logic, components, devices, packages, or mechanisms. Circuitry is a col lection (e.g., set) of circuits implemented in tangible entities that include hardware (e.g., simple circuits, gates, logic, etc.). Circuitry membership may be flexible over time and underlying hardware variability. Circuitries include members that may, alone or in combination, perform specific tasks when operating. In an example, hardware of the circuitry may be immutably designed to carry out a specific operation (e.g., hardwired). In an example, the hardware of the circuitry may include variably connected physical components (e.g., execution units, transistors, simple circuits, etc.) including a computer-readable medium physically modified (e.g., magnetically, electrically, moveable placement of invariant massed particles, etc.) to encode instructions of the specific operation. In connecting the physical components, the underlying electrical properties of a hardware constituent are changed, for example, from an insulator to a conductor or vice versa. The instructions enable participating hardware (e.g., the execution units or a loading mechanism) to create members of the circuitry in hardware via the variable connections to carry out portions of the specific tasks when in operation. Accordingly, the computer-readable medium is communicatively coupled to the other components of the circuitry when the device is operating. In an example, any of the physical components may be used in more than one member of more than one circuitry. For example, under operation, execution units may be used in a first circuit of a first circuitry at one point in time and reused by a second circuit in the first circuitry, or by a third circuit in a second circuitry, at a different time.

The machine (e.g., computer system) 1700 may include a hardware processor 1702 (e.g., a CPU, a GPU, a hardware processor core, or any combination thereof), a main memory 1704, and a static memory 1706, some or all of which may communicate with each other via an interlink (e.g., bus) 1708. The machine 1700 may further include a display device 1710, an alphanumeric input device 1712 (e.g., a keyboard), and a user interface (UI) navigation device 1714 (e.g., a mouse). In an example, the display device 1710, input device 1712, and UI navigation device 1714 may be a touch screen display. The machine 1700 may additionally include a storage device (e.g., drive unit) 1721, a signal generation device 1718 (e.g., a speaker), a network interface device 1720, and one or more sensors 1716, such as a global positioning system (GPS) sensor, compass, accelerometer, or other sensor. The machine 1700 may include an output controller 1728, such as a serial (e.g., USB, parallel, or other wired or wireless (e.g., infrared (IR), near field communication (NFC), etc.) connection to communicate or control one or more peripheral devices (e.g., a printer, card reader, etc.).

The machine 1700 may include a machine-readable medium 1722 on which is stored one or more sets of data structures or instructions 1724 (e.g., software) embodying or utilized by the machine 1700 to perform any one or more of the techniques or functions for which the machine 1700 is designed. The instructions 1724 may also reside, completely or at least partially, within the main memory 1704, within static memory 1706, within mass storage 1721, or within the hardware processor 1702 during execution thereof by the machine 1700. In an example, one or any combination of the hardware processor 1702, the main memory 1704, the static memory 1706, or the mass storage 1721 may constitute the machine-readable medium 1722.

While the machine-readable medium 1722 is illustrated as a single medium, the term "machine-readable medium" may include a single medium or multiple media (e.g., a centralized or distributed database, or associated caches and servers) configured to store the one or more instructions 1724. The term "machine-readable medium" may include any medium that is capable of storing, encoding, or carrying instructions for execution by the machine 1700 and that cause the machine 1700 to perform any one or more of the techniques to which the machine 1700 is designed, or that is capable of storing, encoding or carrying data structures used by or associated with such instructions. Non-limiting machine-readable medium examples may include solid-state memories, and optical and magnetic media. In an example, a massed machine-readable medium comprises a machine-readable medium with a plurality of particles having invariant (e.g., rest) mass. Accordingly, massed machine-readable media are not transitory propagating signals. Specific examples of massed machine-readable media may include: non-volatile memory, such as semiconductor memory devices (e.g., EPROM, EEPROM) and flash memory devices; magnetic disks, such as internal hard disks and removable disks; magneto-optical disks; and compact disc-ROM (CD-ROM) and digital versatile disc-read only memory (DVD-ROM) disks.

The instructions 1724 (e.g., software, programs, an operating system (OS), etc.) or other data stored on the mass storage 1721, can be accessed by the main memory 1704 for use by the processor 1702. The main memory 1704 (e.g., DRAM) is typically fast, but volatile, and thus a different, type of storage than the mass storage 1721 (e.g., an SSD), which is suitable for long-term storage, including while in an "off" condition. The instructions 1724 or data in use by a user or the machine 1700 are typically loaded in the main memory 1704 for use by the processor 1702. When the main memory 1704 is full, virtual space from the mass storage 1721 can be allocated to supplement the main memory 1704; however, because the mass storage 1721 is typically slower than the main memory 1704, and write speeds are typically at least twice as slow as read speeds, use of virtual memory can greatly reduce user experience due to storage device latency (in contrast to the main memory 1704, e.g., DRAM). Further, use of the mass storage 1721 for virtual memory can greatly reduce the usable lifespan of the mass storage 1721.

In contrast to virtual memory, virtual memory compression (e.g., the Linux® kernel feature "ZRAM") uses pail of the memory as compressed block storage to avoid paging to the mass storage 1721. Paging takes place in the compressed block until it is necessary to write such data to the mass storage 1721. Virtual memory compression increases the usable size of main memory 1704, while reducing wear on the mass storage 1721.

Storage devices optimized for mobile electronic devices, or mobile storage, traditionally include MMC solid-state storage devices (e.g., micro Secure Digital (microSD™) cards, etc.). MMC devices include a number of parallel interfaces (e.g., an 8-bit parallel interface) with a host device, and are often removable and separate components from the host device. In contrast, eMMC™ devices are attached to a circuit board and considered a component of the host device, with read speeds that rival SATA-based SSD devices. However, demand for mobile device performance continues to increase, such as to fully enable virtual or augmented-reality devices, utilize increasing networks speeds, etc. In response to this demand, storage devices have shifted from parallel to serial communication interfaces. UFS devices, including controllers and firmware, communicate with a host device using a low-voltage differential signaling (LYDS) serial interface with dedicated read/write paths, further advancing greater read/write speeds.

The instructions 1724 may further be transmitted or received over a communications network 1726 using a transmission medium via the network interface device 1720 utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device 1720 may include one or more physical jacks (e.g., Ethernet, coaxial, or phone jacks) or one or more antennas to connect to the communications network 1726. In an example, the network interface device 1720 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any tangible medium that is capable of carrying instructions to and for execution by the machine 1700, and includes instrumentalities to propagate digital or analog communications signals to facilitate communication of such instructions, which instructions may be implemented by software.

The following are example embodiments of devices and methods, in accordance with the teachings herein.

An example memory device 1 can comprise: a memory array having multiple groups of strings of memory cells, the multiple groups coupled to respective data lines of multiple data lines of the memory array; a current sensor to measure total current to the respective data lines coupled to a group of the multiple groups of strings; a memory controller including processing circuitry including one or more processors, the memory controller configured to perform operations comprising: monitoring the total current to the respective data lines coupled to the group during a read operation, the read operation including applying a voltage waveform having a positive slope to a selected access line; determining, from the monitoring of the total current, attainment of a selected value of a change of the total current with respect to time; and generating a latch signal in response to the determination; and sense latches coupled to the respective data lines coupled to the group to capture data status in the read operation in response to receiving the latch signal.

An example memory device 2 can include features of example memory device 1 and can include one or more storage elements to store a value of an offset, the offset used with a minimum value of a change of the total current with respect to time to generate the latch signal.

An example memory device 3 can include features of any of the preceding example memory devices and can include a waveform generator to apply the voltage waveform to the selected access line coupled to memory cells of respective strings of the group of the groups of strings such that the memory cells are included in the capture of data status.

An example memory device 4 can include features of example memory device 3 and any of the preceding example memory devices and can include the waveform generator being operable to apply a linear voltage waveform or a non-linear voltage waveform.

An example memory device 5 can include features of example memory device 4 and any of the preceding example memory devices and can include one or more storage elements to store measured values of the total current and differences between measured values of the total current and previous measured values of the total current; and one or more circuits to determine the differences between the measured values of the total current and the previous measured values of the total current and to determine a minimum difference from the determined differences between measured values and previous measured values.

An example memory device 6 can include features of any of the preceding example memory devices and can include the current sensor including a counter to count a number of charges or discharges associated with a charge pump used in providing the current.

An example memory device 7 can include features of any of the preceding example memory devices and can include the current sensor including a resistance coupled between a voltage supply and a node to which the respective data lines of the group are coupled.

An example memory device 8 can include features of example memory device 7 and any of the preceding example memory devices and can include the resistance being coupled to an amplifier with one end of the resistance coupled to an input of the amplifier and the other end of the resistance coupled to another input of the amplifier and with an output of the amplifier coupled to a digital-to-analog converter.

An example memory device 9 can include features of any of the preceding example memory devices and can include the current sensor being structured as a non-contact sensor that senses flux caused by flowing current.

In an example memory device 10, any of the memory devices of example memory devices 1 to 9 may include memory devices incorporated into an electronic memory apparatus further comprising a host processor and a communication bus extending between the host processor and the memory device.

In an example memory device 11, any of the memory devices of example memory devices 1 to 10 may be modified to include any structure presented in another of example memory device 1 to 10.

In an example memory device 12, any apparatus associated with the memory devices of example memory devices 1 to 11 may further include a machine-readable storage device configured to store instructions as a physical state, wherein the instructions may be used to perform one or more operations of the apparatus.

In an example memory device 13, any of the memory devices of example memory devices 1 to 12 may be operated in accordance with any of the methods of the below example methods 1 to 8.

An example memory device 14 can comprise: a memory array having multiple groups of strings of memory cells, the multiple groups coupled to respective data lines of the memory array; a current sensor to measure total current to the respective data lines coupled to a group of the groups of strings; a current source to provide current to the strings of the group; a memory controller including processing circuitry including one or more processors, the memory controller configured to perform operations in a read operation comprising: turning on the current source with the respective data lines coupled to the group in a non-conducting state; applying a ramp voltage to a selected access line coupled to memory cells of the strings of the group; monitoring the total current to the respective data lines coupled to the group; determining, from the monitoring of the total current, a minimum value of a change of the total current with respect to time; and generating a latch signal in response to the determination; and sense latches coupled to the respective data lines coupled to the group to capture data status in the read operation in response to receiving the latch signal.

An example memory device 15 can include features of example memory device 14 and any of the preceding example memory devices and can include the memory controller being operable to execute generating the latch signal at a time corresponding to the minimum value of the change of the total current with respect to time adjusted by a time corresponding to an offset An example memory device 16 can include features of example memory device 15 and any of the preceding example memory devices and can include the memory controller being operable to execute instructions to determine a value of the offset.

In an example memory device 17, any of the memory devices of example memory devices 14 to 16 may include memory devices incorporated into an electronic memory apparatus further comprising a host processor and a communication bus extending between the host processor and the memory device.

In an example memory device 18, any of the memory devices of example memory devices 14 to 17 may be modified to include any structure presented in another of example memory device 14 to 17.

In an example memory device 19, any of apparatus associated with the memory devices of example memory devices 14 to 18 may further include a machine-readable storage device configured to store instructions as a physical state, wherein the instructions may be used to perform one or more operations of the apparatus.

In an example memory device 20, any of the memory devices of example memory devices 14 to 19 may be operated in accordance with any of the methods of the following example methods 1 to 8.

An example method 1 of reading a memory device can comprise: turning on a current source to provide current to selected strings of a selected group of multiple groups of strings of a memory array, with the selected strings selected by a block or sub-block configuration and with the multiple groups coupled to respective data lines of the memory array; applying a voltage waveform to a selected access line coupled to memory ceils of the selected strings of the selected group, the voltage waveform having a positive slope; monitoring a total current to the respective data lines coupled to the selected strings of the selected group during a read operation; determining, from the monitoring of the total current, attainment of a selected value of a change of the total current with respect to time; and generating, in response to determining the attainment of the selected value, a latch signal in response to the determination to latch data status of the memory cells.

An example method 2 of reading a memory device can include features of example method 1 of reading a memory device and can include determining a difference between a measured value of the total current and a previous measured value of the total current for multiple iterations of measured values and previous measured values; and determining a minimum difference of the determined differences of the multiple iterations.

An example method 3 of reading a memory device can include features of example method 2 of reading a memory device and features of any of the preceding example methods of reading a memory device and can include generating the latch signal to include generating the latch signal at a time corresponding to the minimum difference adjusted by a time corresponding to an offset.

An example method 4 of reading a memory device can include features of any of the preceding example methods of reading a memory device and can include, prior to applying the voltage waveform to the selected access line: conducting the turning on of the current, source; and applying on-voltages to access lines, other than the selected access line, coupled to the selected strings of the selected group and on-voltages to select gates of the selected strings of the selected group.

An example method 5 of reading a memory device can include features of any of the preceding example methods of reading a memory device and can include applying the voltage waveform to include applying a linear ramp signal or a non-linear signal.

An example method 6 of reading a memory device can include features of any of the preceding example methods of reading a memory device and can include monitoring the total current to include reading output of a current sensor at multiple locations in time.

An example method 7 of reading a memory device can include features of any of the preceding example methods of reading a memory device and can include determining a current offset value to provide the latch signal for latching the data status of the memory cells.

An example method 8 of reading a memory device can include features of any of the preceding example methods of reading a memory device and can include moving data of the data status of memory ceils from sense latches by a next read point, the next read point based on detecting a next attainment of a next selected value of a next change of the total current with respect to time.

In an example method 9 of reading a memory device, any of the example methods 1 to 8 of reading a memory device may be performed in forming an electronic associated with a memory device.

In an example method 10 of reading a memory device, any of the example methods 1 to 9 of reading a memory device may be modified to include operations set forth in any other of method examples 1 to 9 of reading a memory device.

In an example method 11 of reading a memory device, any of the example methods 1 to 10 of reading a memory device may be implemented at least in part through use of instructions stored as a physical state in one or more machine-readable storage devices.

An example method 12 of reading a memory de vice can include features of any of the preceding example methods 1 to 11 of reading a memory device and can include performing functions associated with any features of example memory devices 1 to 19.

An example machine-readable storage device 1 storing instructions, that when executed by one or more processors, cause a machine to perform operations, can comprise instructions to perform functions associated with any features of example memory devices 1 to 20 or perform methods associated with any features of example methods 1 to 12.

In various embodiments, a process is implemented in which a WL ramp voltage is applied to memory cells of strings of memory cells, where the WL ramp voltage changes over time. The changing WL ramp voltage allows for combination of the current in data lines coupled to the strings into a sequence that can be keyed upon to determine the correct read level. In an example procedure, the WL ramp voltage is applied to memory cells to distinguish a valley location in a distribution of programmed states, providing a sequence in time. Cumulative data line current is used to find the valley location. Data is latched at a correct location corresponding to the valley location found. These events occur as a time series. This process can find valley locations using data line current summation as an indicator, by finding the minimum of the rate of change for the signal provided by monitoring the cumulative data line current. The signal generated by the cumulative data line current can be used to find optimum read points.

Although specific embodiments have been illustrated and described herein, it will be appreciated by those of ordinary skill in the art that any arrangement that is calculated to achieve the same purpose may be substituted for the specific embodiments shown. Various embodiments use permutations and/or combinations of embodiments described herein. The above description is intended to be illustrative, and not restrictive, and the phraseology or terminology employed herein is for the purpose of description. In addition, in the foregoing Detailed Description, it can be seen that various features are grouped together in a single embodiment for the purpose of streamlining the disclosure. Combinations of the above embodiments and other embodiments will be apparent to those of skill in the art upon studying the above description.

What is claimed is:

1. A memory device comprising:
   a memory array having multiple groups of strings of memory cells, the multiple groups coupled to respective data lines of multiple data lines of the memory array;
   a current sensor to measure total current to the respective data lines coupled to a group of the multiple groups of strings;
   a memory controller including processing circuitry including one or more processors, the memory controller configured to perform operations comprising:
      monitoring the total current to the respective data lines coupled to the group during a read operation, the read operation including applying a voltage waveform having a positive slope to a selected access line;
      determining, from the monitoring of the total current, attainment of a selected value of a change of the total current with respect to time; and
      generating a latch signal in response to the determination; and
   sense latches coupled to the respective data lines coupled to the group to capture data status in the read operation in response to receiving the latch signal.

2. The memory device of claim 1, wherein the memory device includes one or more storage elements to store a value of an offset, the offset used with a minimum value of a change of the total current with respect to time to generate the latch signal.

3. The memory device of claim 1, wherein the memory device includes a waveform generator to apply the voltage waveform to the selected access line coupled to memory cells of respective strings of the group of the groups of strings such that the memory cells are included in the capture of data status.

4. The memory device of claim 3, wherein the waveform generator is operable to apply a linear voltage waveform or a non-linear voltage waveform.

5. The memory device of claim 1, wherein the memory device includes:
   one or more storage elements to store measured values of the total current and differences between measured values of the total current and previous measured values of the total current; and
   one or more circuits to determine the differences between the measured values of the total current and the previous measured values of the total current and to determine a minimum difference from the determined differences between measured values and previous measured values.

6. The memory device of claim 1, wherein the current sensor includes a counter to count a number of charges or discharges associated with a charge pump used in providing the current.

7. The memory device of claim 1, wherein the current sensor includes a resistance coupled between a voltage supply and a node to which the respective data lines of the group are coupled.

8. The memory device of claim 7, wherein the resistance is coupled to an amplifier with one end of the resistance coupled to an input of the amplifier and the other end of the resistance coupled to another input of the amplifier and with an output of the amplifier coupled to a digital-to-analog converter.

9. The memory device of claim 1, wherein the current sensor is structured as a non-contact sensor that senses flux caused by flowing current.

10. A method of reading a memory device, the method comprising:
    turning on a current source to provide current to selected strings of a selected group of multiple groups of strings of a memory array, with the selected strings selected by a block or sub-block configuration and with the multiple groups coupled to respective data lines of the memory array;
    applying a voltage waveform to a selected access line coupled to memory cells of the selected strings of the selected group, the voltage waveform having a positive slope;
    monitoring a total current to the respective data lines coupled to the selected strings of the selected group during a read operation;
    determining, from the monitoring of the total current, attainment of a selected value of a change of the total current with respect to time; and
    generating, in response to determining the attainment of the selected value, a latch signal in response to the determination to latch data status of the memory cells.

11. The method of claim 10, wherein determining the attainment of the selected value includes:
    determining a difference between a measured value of the total current and a previous measured value of the total current for multiple iterations of measured values and previous measured values; and
    determining a minimum difference of the determined differences of the multiple iterations.

12. The method of claim 11, wherein generating the latch signal includes generating the latch signal at a time corresponding to the minimum difference adjusted by a time corresponding to an offset.

13. The method of claim 10, wherein the method includes, prior to applying the voltage waveform to the selected access line:
    conducting the turning on of the current source; and
    applying on-voltages to access lines, other than the selected access line, coupled to the selected strings of the selected group and on-voltages to select gates of the selected strings of the selected group.

14. The method of claim 10, wherein applying the voltage waveform includes applying a linear ramp signal or a non-linear signal.

15. The method of claim 10, wherein monitoring the total current includes reading output of a current sensor at multiple locations in time.

16. The method of claim 10, wherein the method includes determining a current offset value to provide the latch signal for latching the data status of the memory cells.

17. The method of claim 10, wherein the method includes moving data of the data status of memory cells from sense latches by a next read point, the next read point based on detecting a next attainment of a next selected value of a next change of the total current with respect to time.

18. A memory device comprising:
    a memory array having multiple groups of strings of memory cells, the multiple groups coupled to respective data lines of the memory array;
    a current sensor to measure total current to the respective data lines coupled to a group of the groups of strings;
    a current source to provide current to the strings of the group;
    a memory controller including processing circuitry including one or more processors, the memory controller configured to perform operations in a read operation comprising:
        turning on the current source with the respective data lines coupled to the group in a non-conducting state;
        applying a ramp voltage to a selected access line coupled to memory cells of the strings of the group;
        monitoring the total current to the respective data lines coupled to the group;
        determining, from the monitoring of the total current, a minimum value of a change of the total current with respect to time; and
        generating a latch signal in response to the determination; and
    sense latches coupled to the respective data lines coupled to the group to capture data status in the read operation in response to receiving the latch signal.

19. The memory device of claim 18, wherein the memory controller is operable to execute generating the latch signal at a time corresponding to the minimum value of the change of the total current with respect to time adjusted by a time corresponding to an offset.

20. The memory device of claim 19, wherein the memory controller is operable to execute instructions to determine a value of the offset.

* * * * *